(12) United States Patent
Lee

(10) Patent No.: US 12,027,511 B2
(45) Date of Patent: Jul. 2, 2024

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 249 days.

(21) Appl. No.: 17/165,408

(22) Filed: Feb. 2, 2021

(65) Prior Publication Data

US 2022/0045045 A1 Feb. 10, 2022

(30) Foreign Application Priority Data

Aug. 6, 2020 (KR) .................. 10-2020-0098769

(51) Int. Cl.
| | |
|---|---|
| *H10B 41/30* | (2023.01) |
| *H01L 23/00* | (2006.01) |
| *H01L 25/00* | (2006.01) |
| *H01L 25/065* | (2023.01) |
| *H01L 25/18* | (2023.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC ............ *H01L 25/18* (2013.01); *H01L 24/32* (2013.01); *H01L 25/0657* (2013.01); *H01L 25/50* (2013.01); *H10B 41/27* (2023.02); *H10B 41/41* (2023.02); *H10B 43/27* (2023.02); *H10B 43/40* (2023.02); *H01L 2224/32145* (2013.01); *H01L 2224/83896* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | | |
|---|---|---|---|---|
| 9,524,903 | B2* | 12/2016 | Lee ................. | H10B 43/10 |
| 10,115,681 | B1 | 10/2018 | Ariyoshi | |
| 10,304,852 | B1 | 5/2019 | Cui et al. | |
| 2013/0075920 | A1* | 3/2013 | Chen ................. | H10B 41/50 |
| | | | | 438/622 |
| 2016/0027730 | A1 | 1/2016 | Lee | |

(Continued)

FOREIGN PATENT DOCUMENTS

CN 110634874 A 12/2019

*Primary Examiner* — Sarah K Salerno
(74) *Attorney, Agent, or Firm* — WILLIAM PARK & ASSOCIATES LTD.

(57) ABSTRACT

There are provided a semiconductor memory device and a manufacturing method of a semiconductor memory device. The semiconductor memory device includes: a peripheral circuit layer; a bonding structure disposed on the peripheral circuit layer; a channel structure disposed on the bonding structure; a first gate contact structure including a first vertical part penetrating the bonding structure and a first horizontal part intersecting with the first vertical part and extending from the first vertical part; and a first gate conductive pattern in contact with a side all of the first horizontal part, the first gate conductive pattern being spaced apart from the first vertical part, the first gate conductive pattern extending to surround the channel structure.

9 Claims, 47 Drawing Sheets

(56) References Cited

U.S. PATENT DOCUMENTS

| | | | |
|---|---|---|---|
| 2017/0256588 A1* | 9/2017 | Fukuda | H01L 29/7926 |
| 2018/0247953 A1* | 8/2018 | Lee | H10B 43/40 |
| 2019/0081069 A1 | 3/2019 | Lu et al. | |
| 2019/0333929 A1 | 10/2019 | Lee | |
| 2020/0328227 A1* | 10/2020 | Kang | H10B 43/27 |
| 2022/0173119 A1* | 6/2022 | Choi | H10B 43/27 |
| 2022/0208696 A1* | 6/2022 | Lee | H01L 23/562 |

* cited by examiner

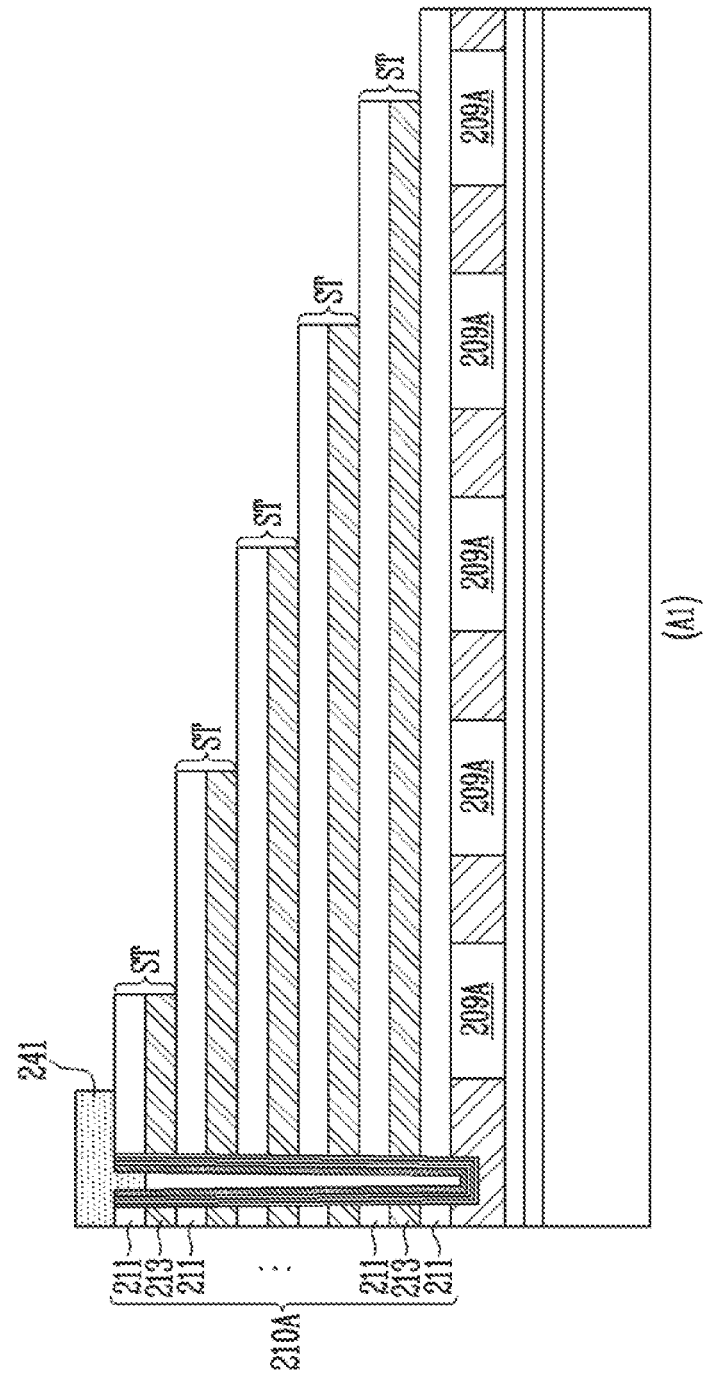

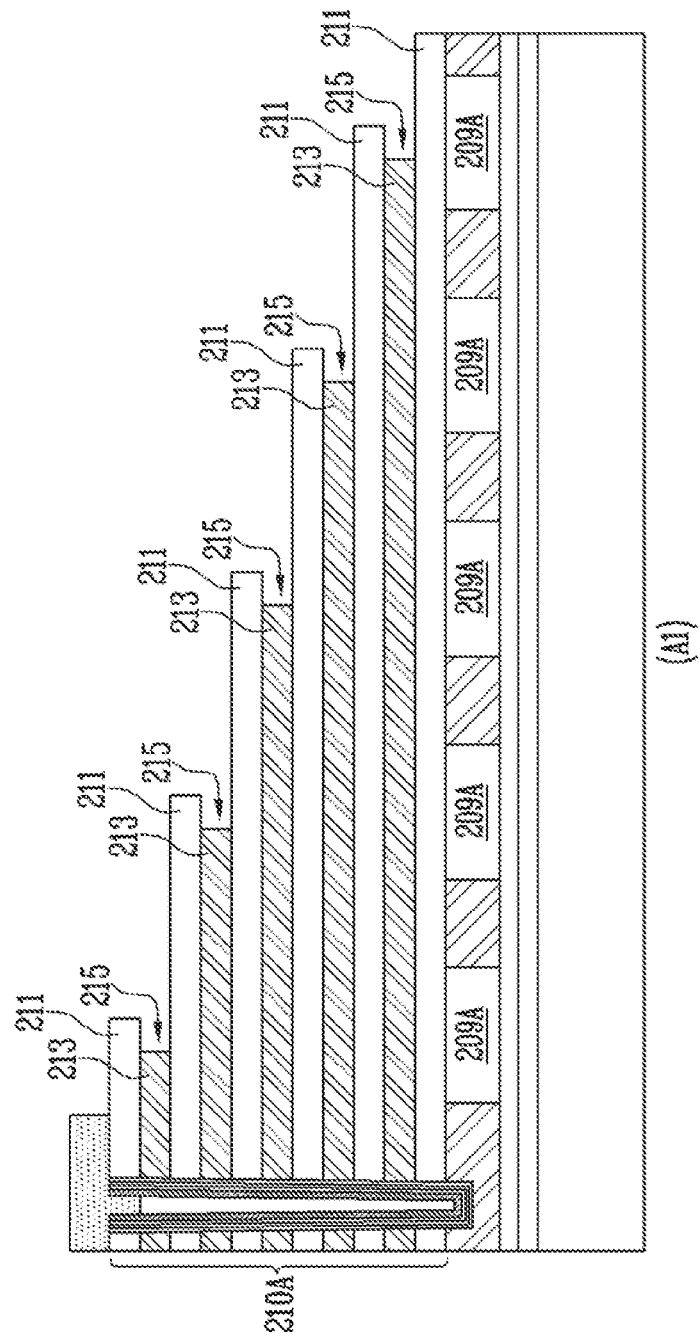

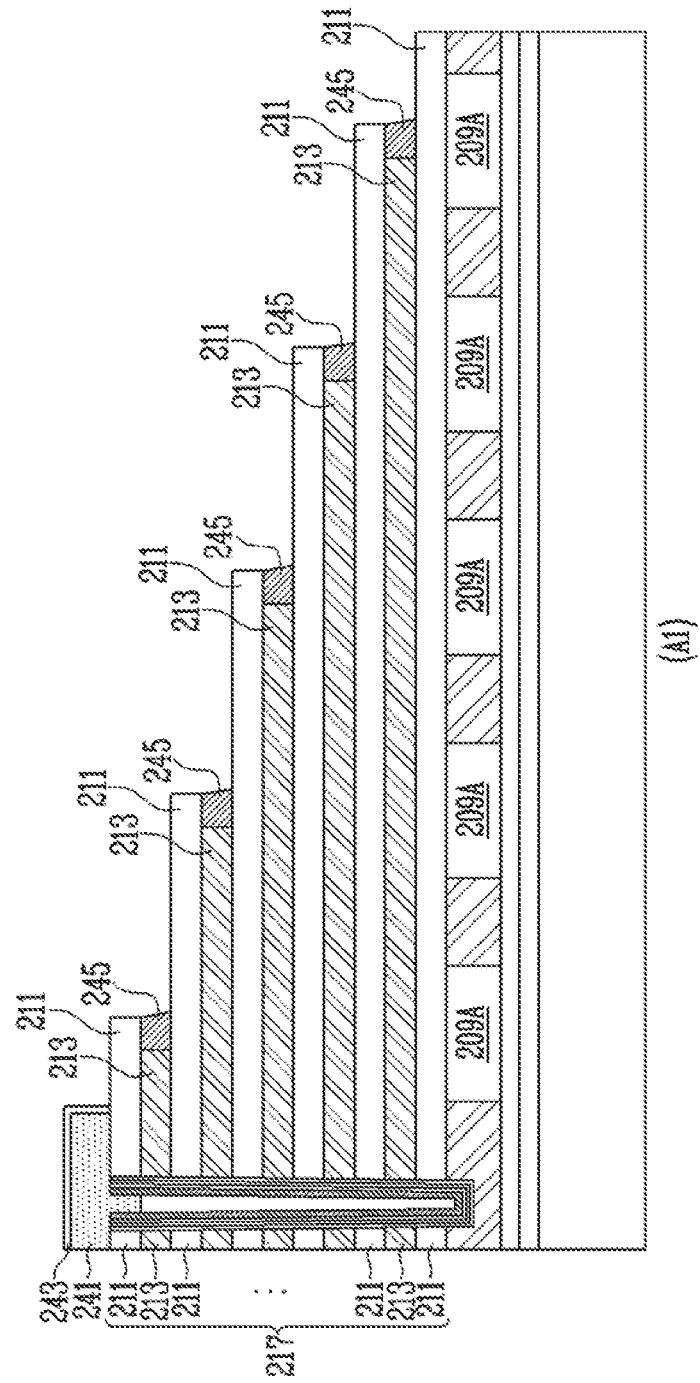

(A2)

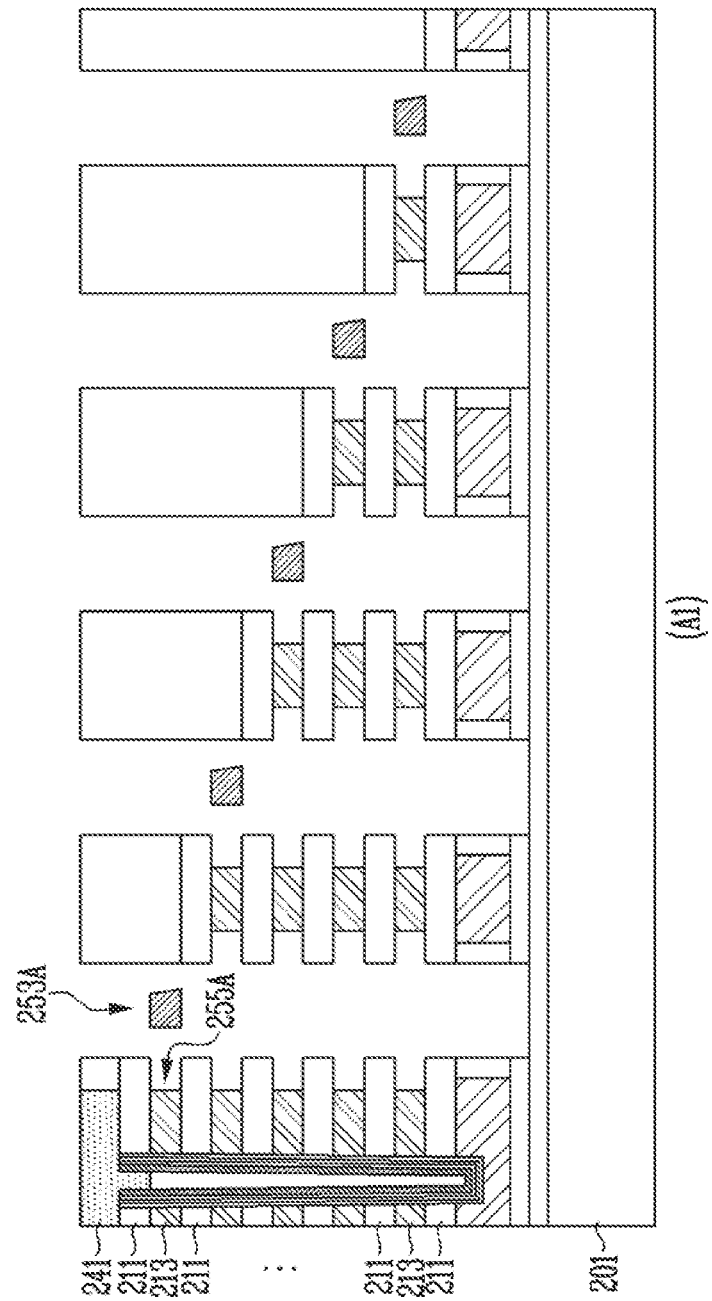

(A2)

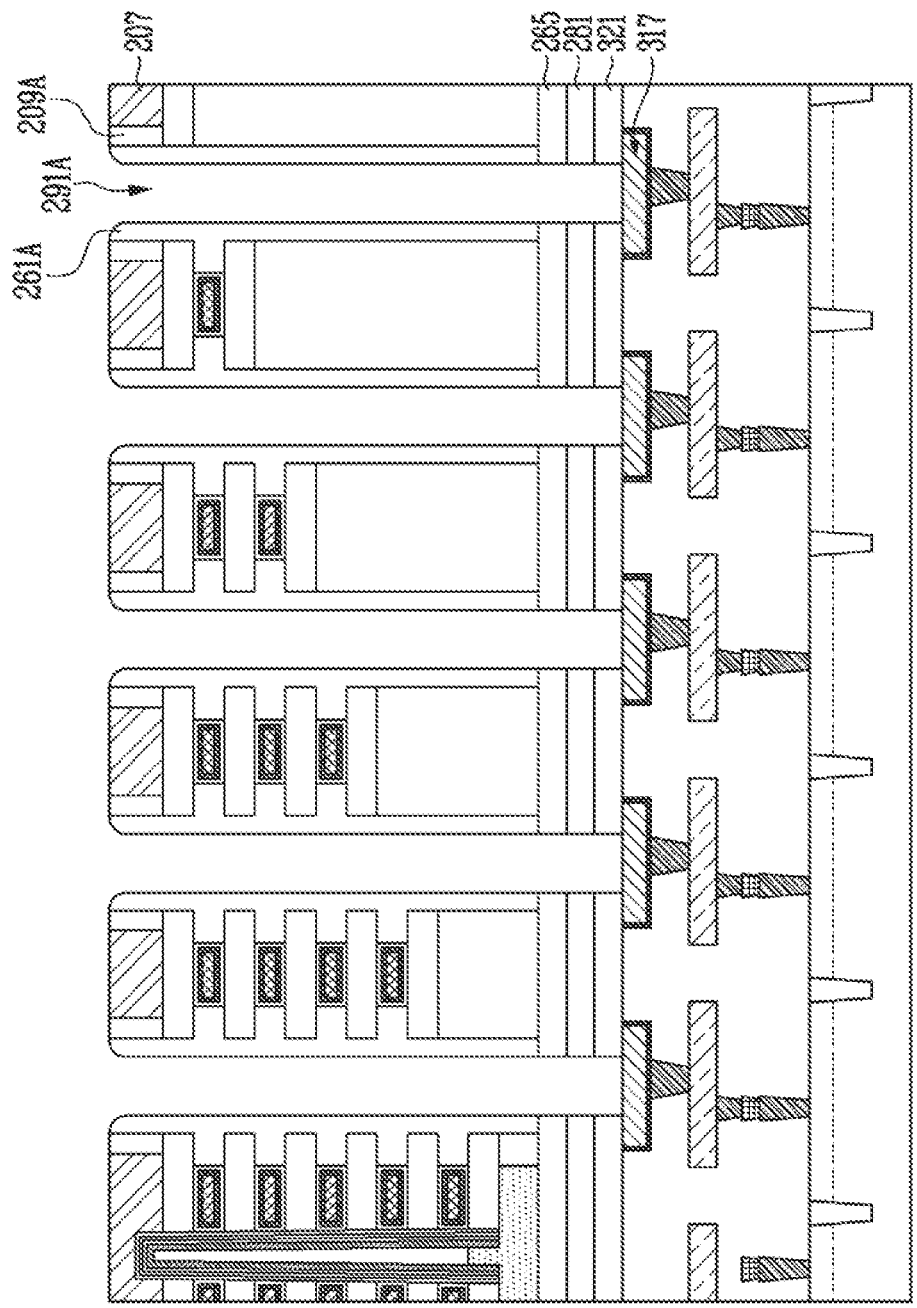

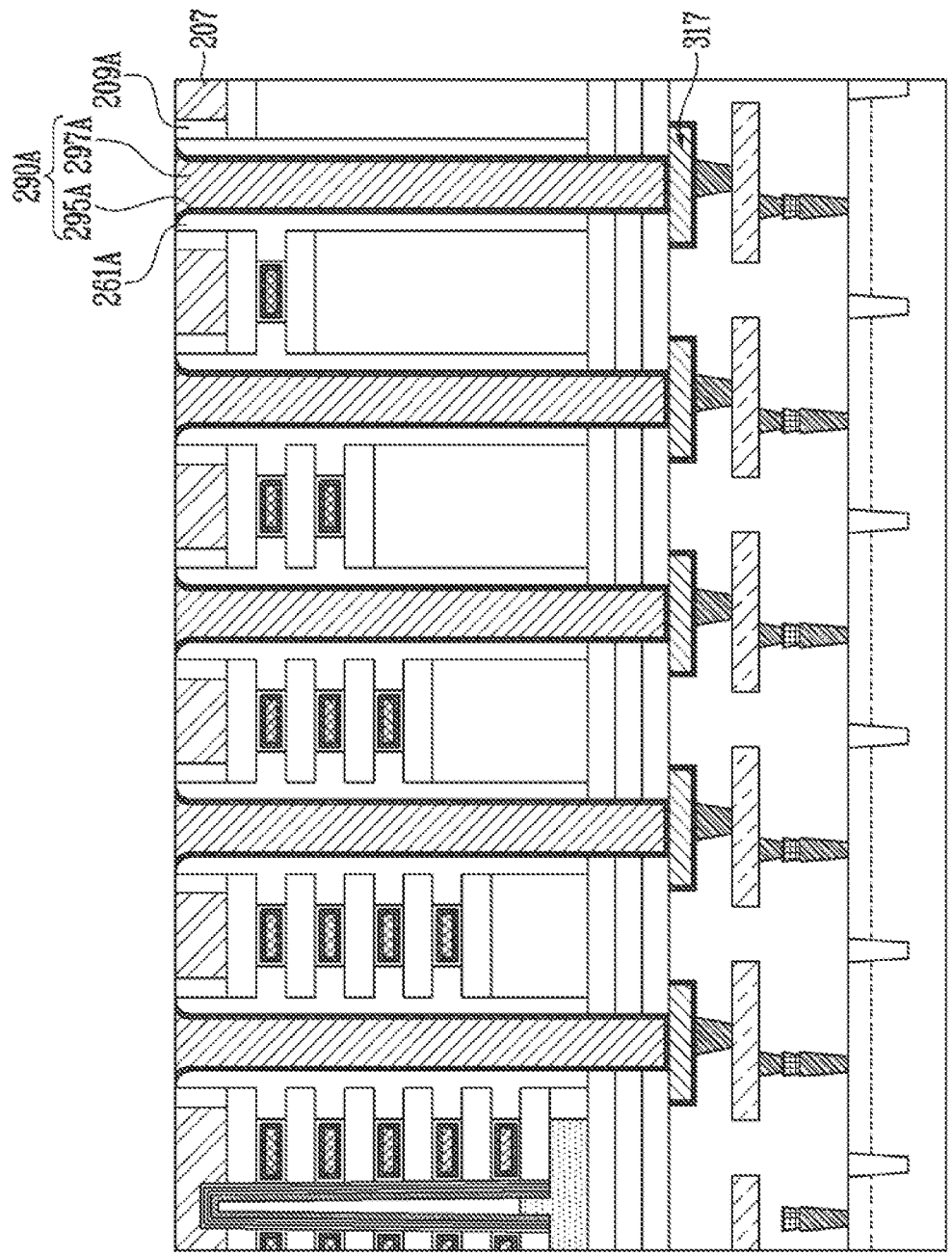

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2020-0098769, filed on Aug. 6, 2020, in the Korean Intellectual Property Office, the entire disclosure of which is incorporated herein by reference.

BACKGROUND

1. Technical Field

The present disclosure may generally relate to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device includes a memory cell array and a peripheral circuit connected to the memory cell array. The memory cell array includes a plurality of memory cells capable of storing data, and the peripheral circuit is configured to perform various operations.

In order to improve the degree of integration of the semiconductor memory device, the memory cell array may include memory cells three-dimensionally arranged above the peripheral circuit.

SUMMARY

In an embodiment of the present disclosure, there may be provided a semiconductor memory device including: a peripheral circuit layer; a bonding structure disposed on the peripheral circuit layer; a channel structure disposed on the bonding structure; a first gate contact structure including a first vertical part penetrating the bonding structure and a first horizontal part intersecting with the first vertical part and extending from the first vertical part; and a first gate conductive pattern in contact with a sidewall of the first horizontal part and spaced apart from the first vertical part, wherein the first gate conductive pattern extends to surround the channel structure.

In an embodiment of the present disclosure, there may be provided a semiconductor memory device including: a peripheral circuit layer including a first region and a second region; a bonding structure disposed on the peripheral circuit layer; a cell stack structure overlapping with the first region, wherein the cell stack structure includes gate conductive patterns and interlayer insulating layers, which are alternately stacked on the bonding structure; a channel structure penetrating the cell stack structure; a dummy stack structure overlapping with the second region, wherein the dummy stack structure includes first material layers and second material layers, which are alternately stacked on the bonding structure; a vertical contact structure penetrating the dummy stack structure and the bonding structure to be connected to the peripheral circuit layer; and a dummy spacer insulating layer surrounding a sidewall of the vertical contact structure, wherein the dummy spacer insulating layer includes a pillar part extending along the sidewall of the vertical contact structure and protrusion parts protruding toward the second material layers from the pillar part to fill spaces between the first material layers.

In an embodiment of the present disclosure, there may be provided a method of manufacturing a semiconductor memory device, the method including: forming a step structure on a sacrificial substrate, wherein the step structure includes first material layers stacked to be spaced apart from each other while surrounding a channel structure, a second material layer surrounding the channel structure between the first material layers, and a gap fill pattern disposed on a sidewall of the second material layer between the first material layers; forming a gap fill insulating layer covering the step structure; forming a contact hole intersecting the gap fill pattern, wherein the contact hole penetrates the gap fill insulating layer, the first material layers, and the second material layer; forming a spacer insulating layer on a sidewall of the contact hole; forming a sacrificial pillar to fill a central region of the contact hole, which is opened by the spacer insulating layer; forming a first insulating layer extending to overlap with the sacrificial pillar and the gap fill insulating layer; bonding the first insulating layer to a second insulating layer covering a peripheral circuit layer; and replacing the sacrificial pillar and the gap fill pattern with a gate contact structure penetrating the first insulating layer and the second insulating layer.

In an embodiment of the present disclosure, there may be provided a method of manufacturing a semiconductor memory device, the method including: forming a stack structure on a sacrificial substrate, wherein the stack structure includes first material layers and second material layers, which are alternately stacked; forming a contact hole penetrating the stack structure; etching a portion of each of the second material layers through the contact hole to open gaps between the first material layers; forming a spacer insulating layer filling the gaps, wherein the spacer insulating layer extends along a sidewall of the contact hole; forming a sacrificial pillar to fill a central region of the contact hole, which is opened by the spacer insulating layer; forming a first insulating layer extending to overlap with the sacrificial pillar and the stack structure; bonding a second insulating layer covering a peripheral circuit layer to the first insulating layer; and replacing the sacrificial pillar with a vertical contact structure penetrating the first insulating layer and the second insulating layer.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 10A, 10B, 10C, 10D, 10E, and 10F are process sectional views illustrating a process of forming a step structure in accordance with an embodiment of the present disclosure.

FIGS. 16A, 16B, 17A, and 17B are process sectional views illustrating a process of forming spacer insulating layers and sacrificial pillars in accordance with an embodiment of the present disclosure.

FIGS. 23A and 23B are sectional views illustrating a process of exposing conductive pads.

FIGS. 27A and 27B are sectional views illustrating a gate contact structure and a vertical contact structure in accordance with an embodiment of the present disclosure.

DETAILED DESCRIPTION

Figure 1:
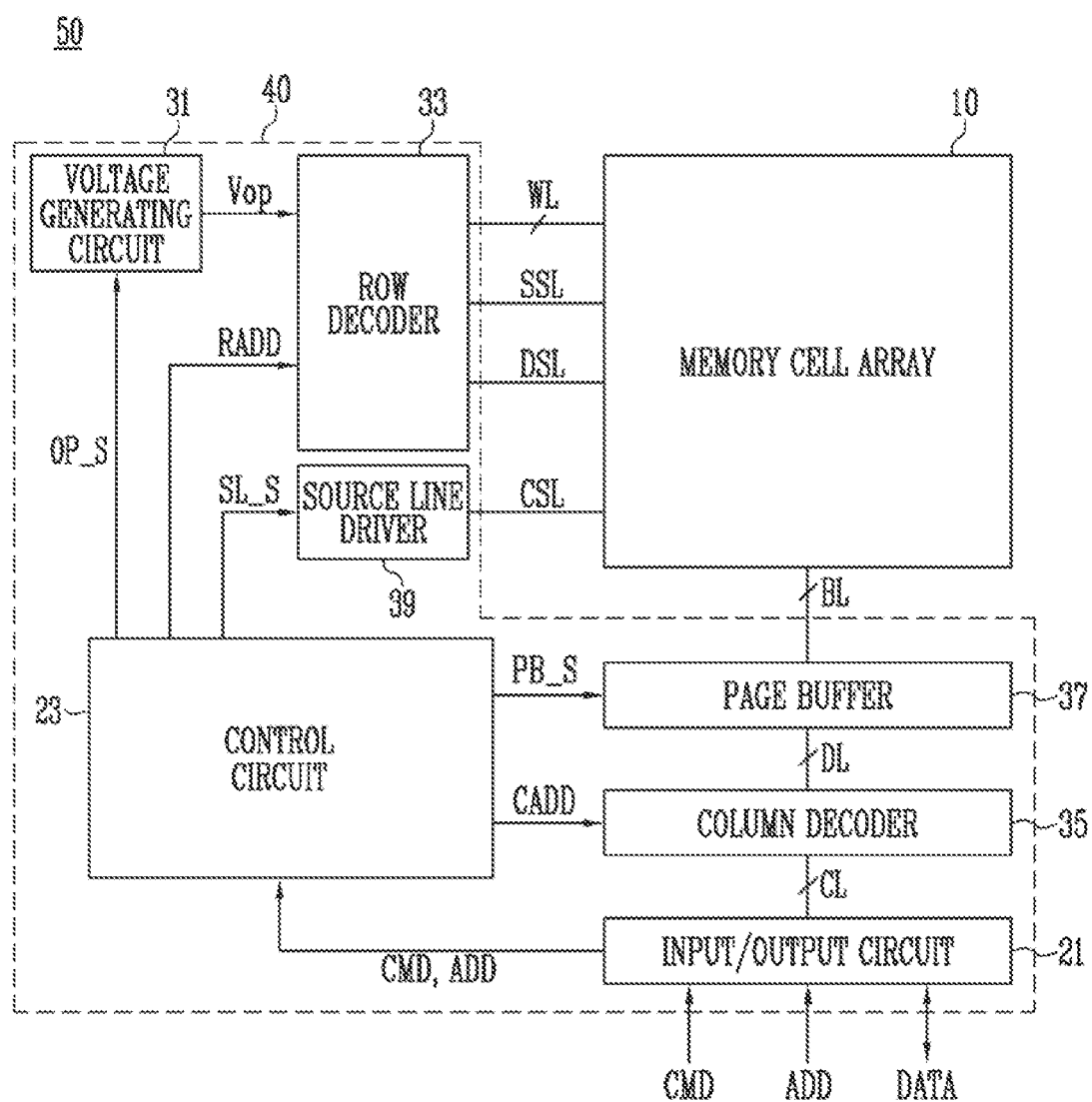
FIG. 1 is a block diagram illustrating a semiconductor memory device in accordance with an embodiment of the present disclosure.

Specific structural or functional descriptions disclosed herein are merely illustrative for the purpose of describing embodiments according to the concept of the present disclosure. The embodiments according to the concept of the present disclosure can be implemented in various forms, and should not be construed as being limited to the specific embodiments set forth herein.

Hereinafter, the terms 'first' and 'second' are used to distinguish one component from another component. The terms may be used to describe various components, but the components are not limited by the terms. Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Embodiments provide a semiconductor memory device capable of improving operational reliability and a manufacturing method of the semiconductor memory device.

FIG. 1 is a block diagram illustrating a semiconductor memory device 50 in accordance with an embodiment of the present disclosure.

Referring to FIG. 1, the semiconductor memory device 50 may include a peripheral circuit 40 and a memory cell array 10.

The peripheral circuit 40 may be configured to perform a program operation for storing data in the memory cell array 10, a read operation for outputting data stored in the memory cell array 10, and an erase operation for erase data stored in the memory cell array 10. In an embodiment, the peripheral circuit 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be three-dimensionally arranged. The memory cell array 10 may be connected to at least one drain select line DSL, a plurality of word lines WL, at least one source select line SSL, a plurality of bit lines BL, and a common source line CSL.

The input/output circuit 21 may transfer, to the control circuit 23, a command CMD and an address ADD, which are transferred from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S. The voltage generating circuit 31 may selectively discharge the drain select line DSL, the word lines WL, and the source select line SSL in response to the operation signal OP_S.

The row decoder 33 may transfer the operating voltages Vop to the drain select line DSL, the word lines WL, and the source select line SSL in response to the row address RADD.

The column decoder 35 may transmit data DATA input from the input/output circuit 21 to the page buffer 37 in response to the column address CADD, or may transmit data DATA stored in the page buffer 37 to the input/output circuit 21. The column decoder 35 may exchange data DATA with the input/output circuit 21 through column lines CL. The column decoder 35 may exchange data DATA with the page buffer 37 through data lines DL.

The page buffer 37 may temporarily store data DATA received through the bit lines BL in response to the page buffer control signal PB_S. The page buffer 37 may sense a voltage or current of the bit lines BL in a read operation.

The source line driver 39 may control a voltage applied to the common source line CSL in response to the source line control signal SL_S.

In order to improve the degree of integration of the semiconductor memory device, a cell stack structure of the memory cell array 10 may overlap with a peripheral circuit layer including the peripheral circuit 40.

Figure 2A:
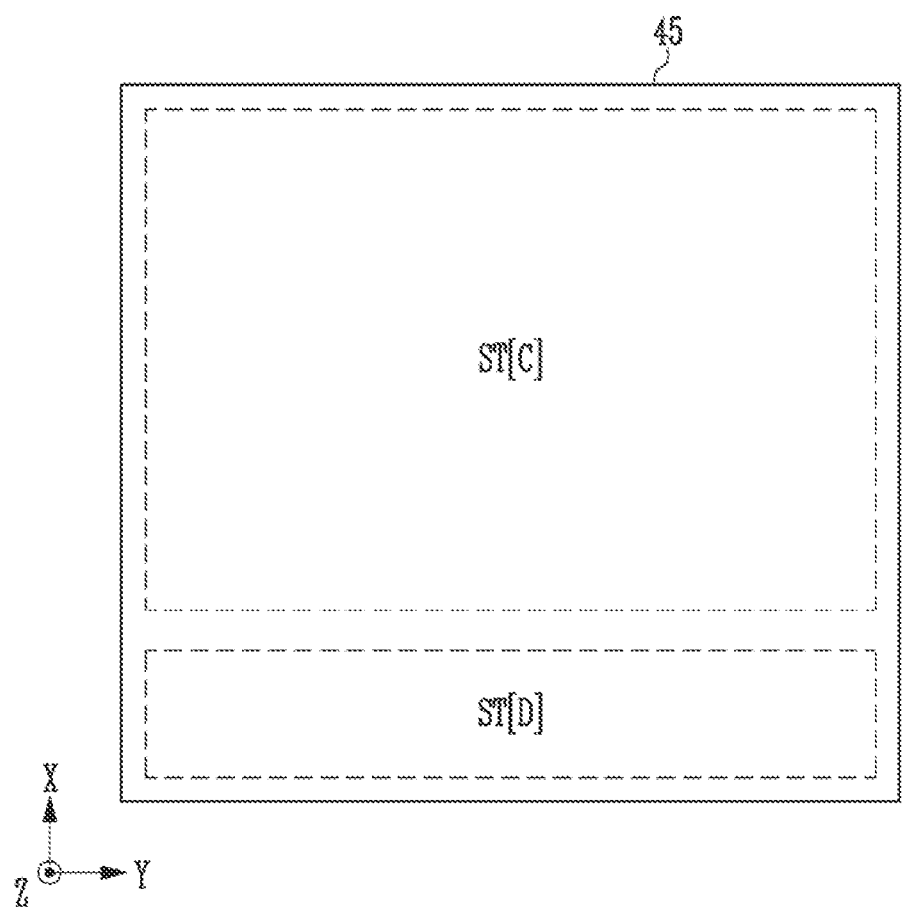
FIGS. 2A, 2B, and 2C are views illustrating a peripheral circuit layer in accordance with embodiments of the present disclosure.
Figure 2B:
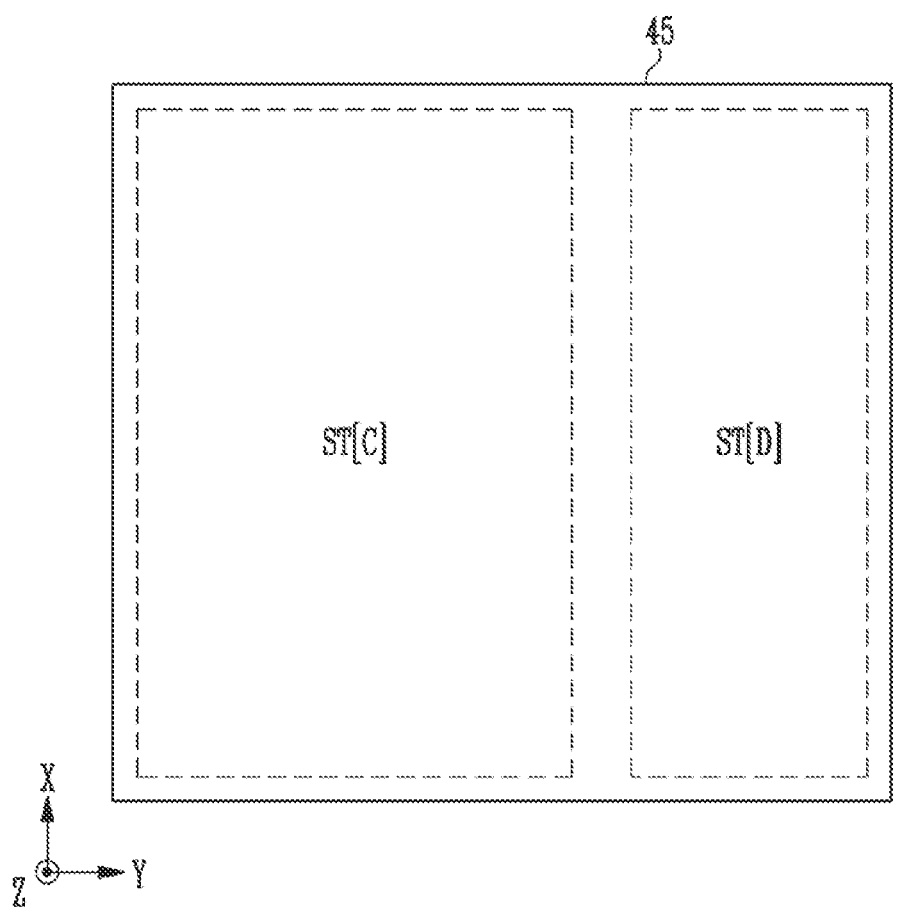
Figure 2C:
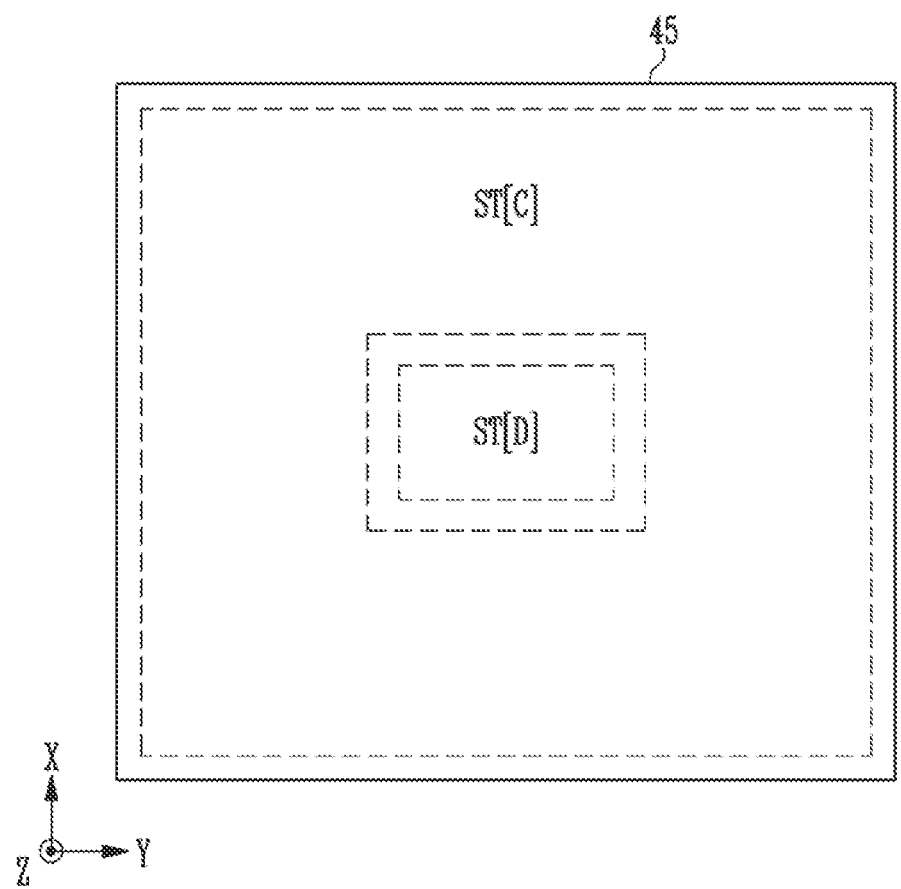

FIGS. 2A, 2B, and 2C are views illustrating a peripheral circuit layer 45 in accordance with embodiments of the present disclosure.

Referring to FIGS. 2A, 2B, and 2C, the peripheral circuit layer 45 may extend in a first direction X and a second direction Y. The peripheral circuit layer 45 may include a first region overlapping with a cell stack structure ST[C] and a second region overlapping with a dummy stack structure ST[D]. Each of the cell stack structure ST[C] and the dummy stack structure ST[D] may include a plurality of layers stacked in a third direction Z above the peripheral circuit layer 45. The first direction X, the second direction Y, and the third direction Z may be directions in which an X-axis, a Y-axis, and a Z-axis of an XYZ coordinate system face.

Figure 26:
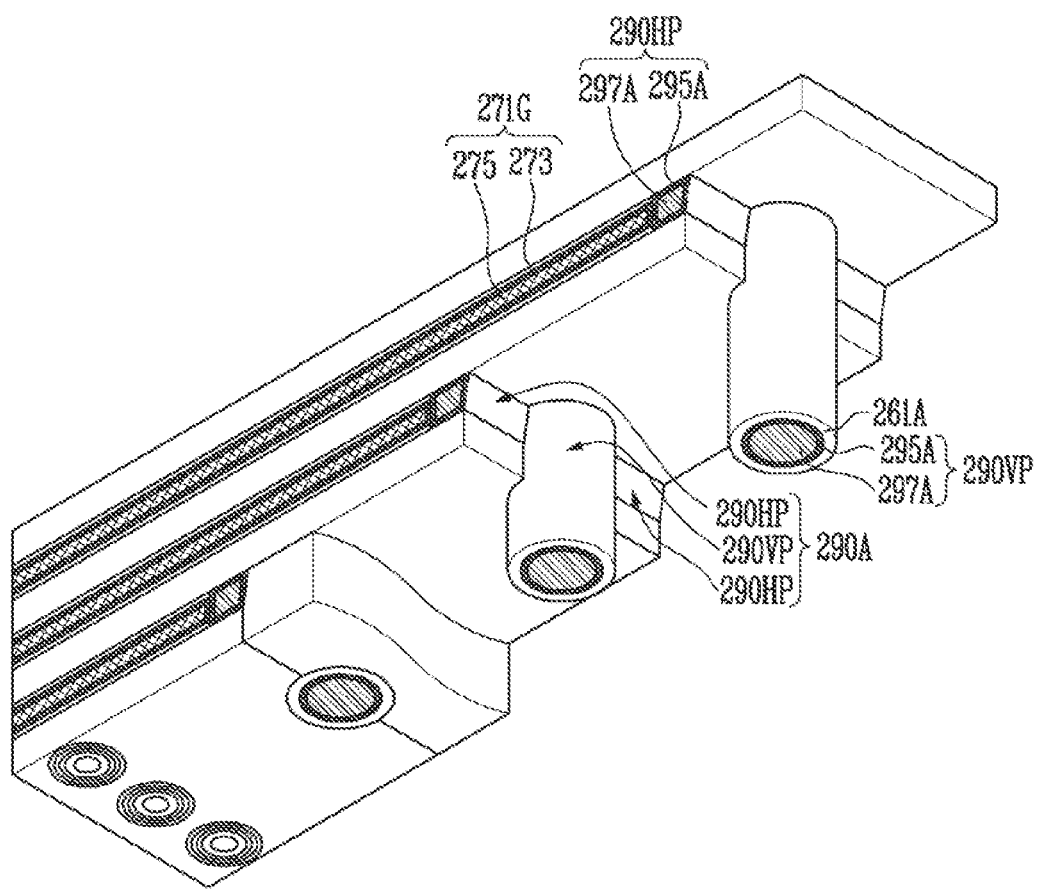

In an embodiment, the dummy stack structure ST[D] may be adjacent to the cell stack structure ST[C] in the first direction X as shown in FIG. 2A. In an embodiment, the dummy stack structure ST[D] may be adjacent to the cell stack structure ST[C] in the second direction Y as shown in FIG. 26. In an embodiment, the dummy stack structure ST[D] may be surrounded by the cell stack structure ST[C] as shown in FIG. 2C.

Figure 3A:
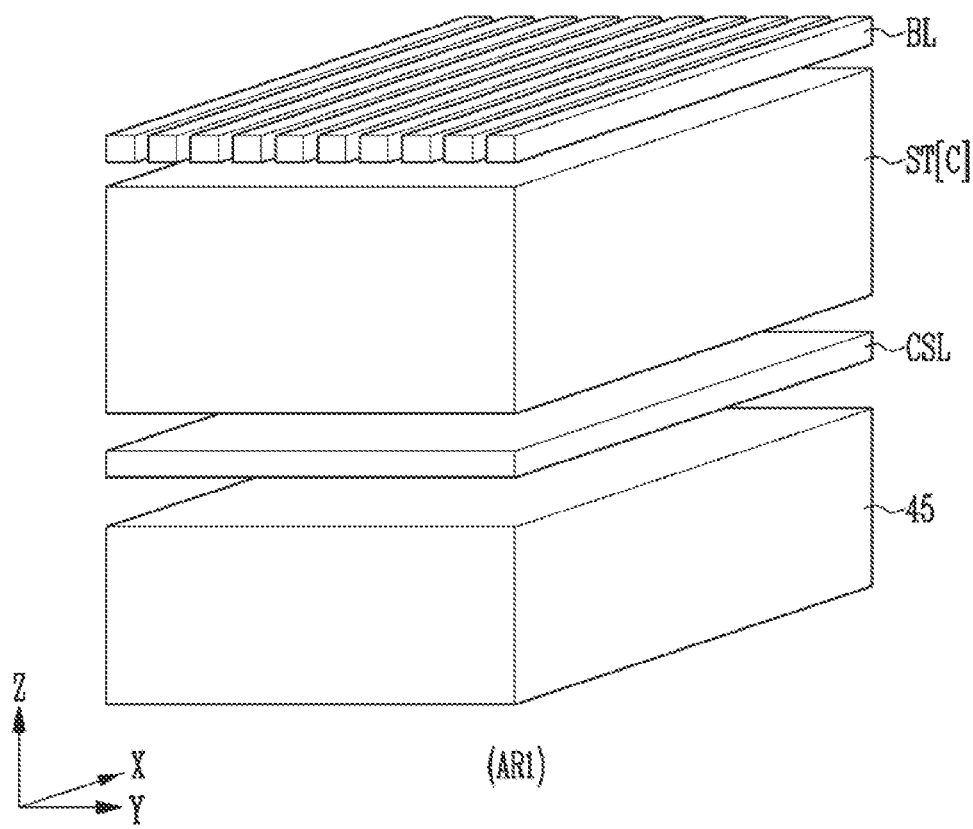
FIGS. 3A and 3B are perspective views illustrating components overlapping with a first region of the peripheral circuit layer in accordance with embodiments of the present disclosure.
Figure 3B:
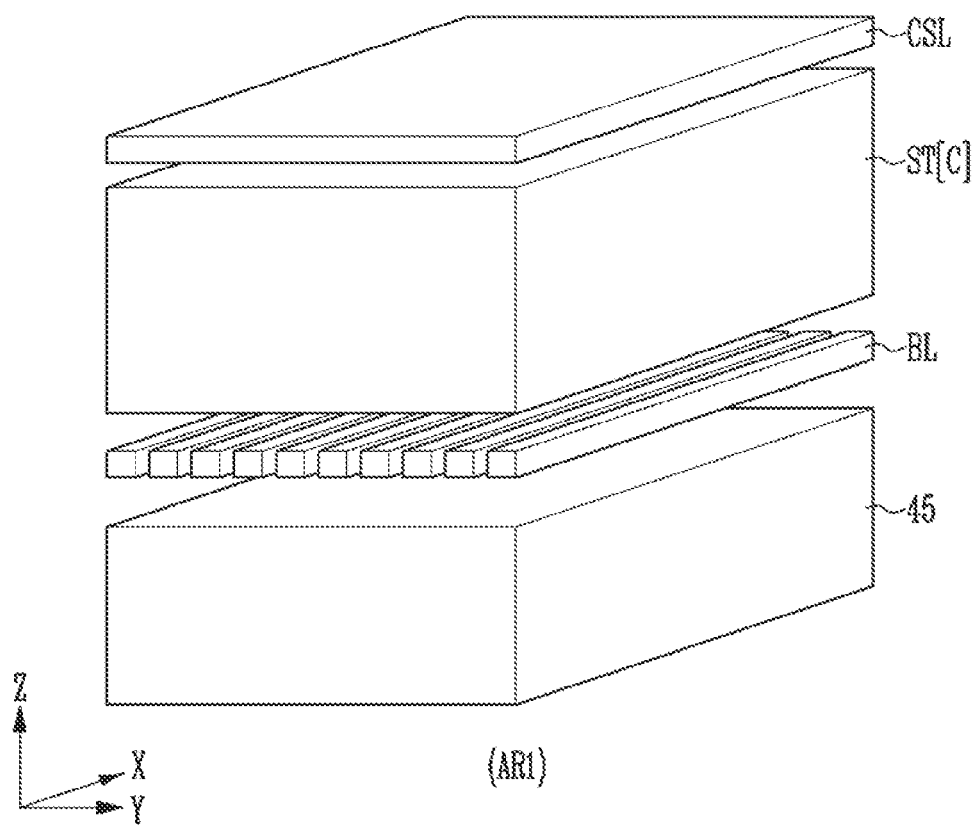

FIGS. 3A and 3B are perspective views illustrating components overlapping with a first region AR1 of the peripheral circuit layer 45 in accordance with embodiments of the present disclosure.

Referring to FIGS. 3A and 3B, a common source line CSL and a plurality of bit lines BL may overlap with the first region AR1 of the peripheral circuit layer 45. The cell stack structure ST[C] may be disposed between the common source line CSL and the plurality of bit lines BL.

Referring to FIG. 3A, in an embodiment, the common source line CSL may be disposed between the cell stack structure ST[C] and the peripheral circuit layer 45, and the bit lines BL may overlap with the common source line CSL with the cell stack structure ST[C] interposed between the bit lines BL and the common source line CSL.

Referring to FIG. 3B, in an embodiment, the bit lines BL may be disposed between the cell stack structure ST[C] and the peripheral circuit layer 45, and the common source line CSL may overlap with the bit lines BL with the cell stack structure ST[C] interposed between the common source line CSL and the bit lines BL.

Figure 4:
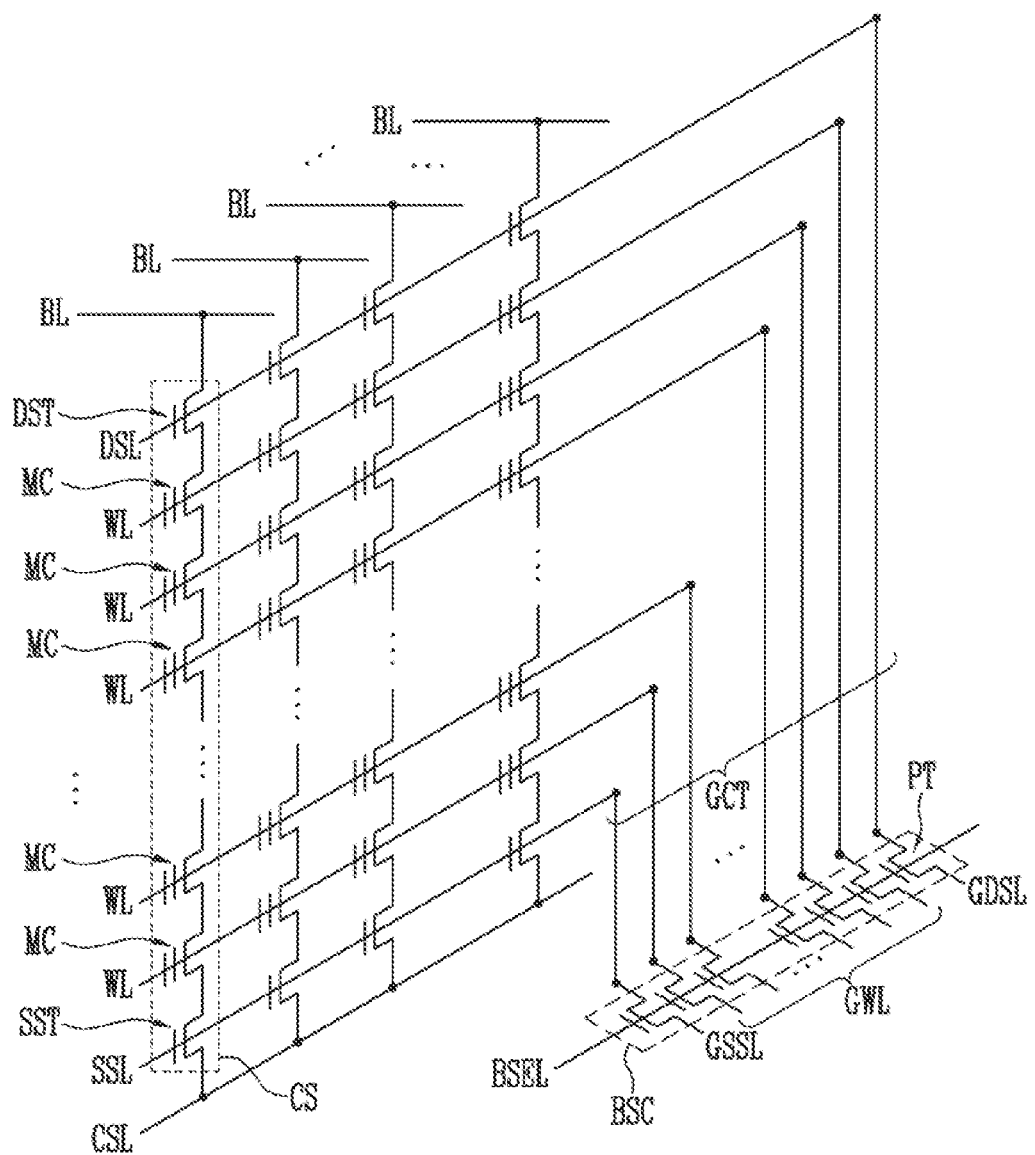
FIG. 4 is a circuit diagram of a memory cell array in accordance with an embodiment of the present disclosure.

FIG. 4 is a circuit diagram of a memory cell array in accordance with an embodiment of the present disclosure.

Referring to FIG. 4, the memory cell array may include a plurality of memory cell strings CS respectively connected to a plurality of bit lines BL. The plurality of memory cell strings CS may be commonly connected to a common source line CSL.

Each of the memory cell strings CS may include at least one source select transistor SST, a plurality of memory cells MC, and at least one drain select transistor DST, which are stacked between the common source line CSL and the bit line BL.

The source select transistor SST may control electrical connection between the plurality of memory cells MC and the common source line CSL. The drain select transistor DST may control electrical connection between the plurality of memory cells MC and the bit line BL.

One source select transistor SST may be disposed between the common source line CSL and the plurality of memory cells MC, or two or more source select transistors connected in series may be disposed between the common source line CSL and the plurality of memory cells MC. One drain select transistor DST may be disposed between the bit line BL and the plurality of memory cells MC, or two or more drain select transistors connected in series may be disposed between the bit line BL and the plurality of memory cells MC.

The memory cells MC may be respectively connected to word lines WL. Operations of the memory cells MC may be controlled by cell gate signals applied to the word lines WL. The source select transistor SST may be connected to a source select line SSL. An operation of the source select transistor SST may be controlled by a source gate signal applied to the source select line SSL. The drain select line DST may be connected to a drain select line DSL. An operation of the drain select transistor DST may be controlled by a drain gate signal applied to the drain select line DSL.

The source select line SSL, the drain select line DSL, and the word lines WL may be connected to a block select circuit BSC. The block select circuit BSC may be included in the row decoder 33 described with reference to FIG. 1. In an embodiment, the block select circuit BSC may include pass transistors PT respectively connected to the source select line SSL, the drain select line DSL, and the word line WL. Gates of the pass transistors PT may be connected to a block select line BSEL. The pass transistors PT may transfer voltages applied to global lines GSSL, GWL, and GDSL to the source select line SSL, the drain select line DSL, and the word lines WL in response to a block select signal applied to the block select line BSEL.

The block select circuit BSC may be connected to the source select line SSL, the drain select line DSL, and the word lines WL via gate contact structures GCT.

Figure 5:
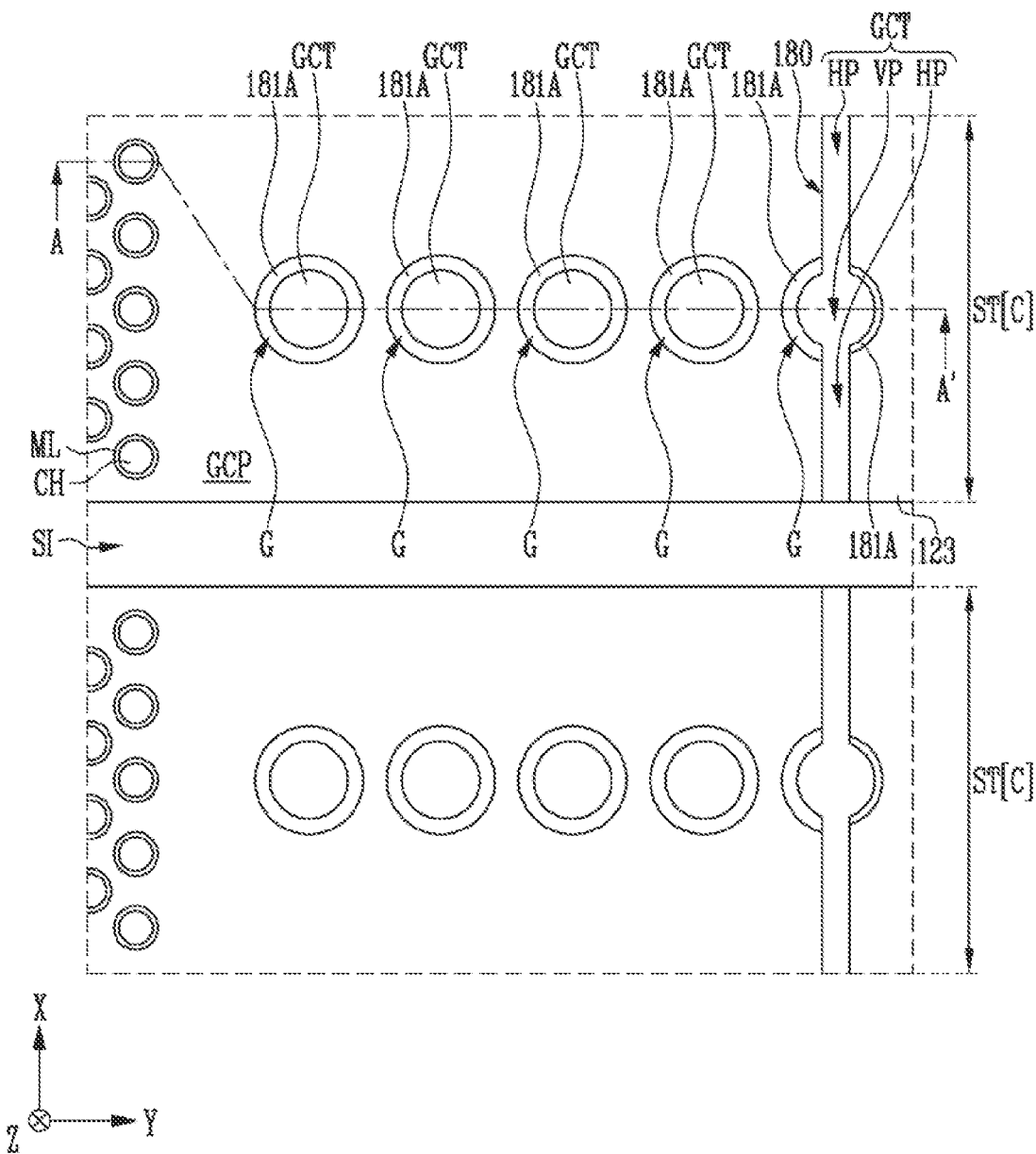
FIG. 5 is a plan view illustrating cell stack structures in accordance with an embodiment of the present disclosure.

FIG. 5 is a plan view illustrating cell stack structures ST[C] in accordance with an embodiment of the present disclosure.

Figure 6:
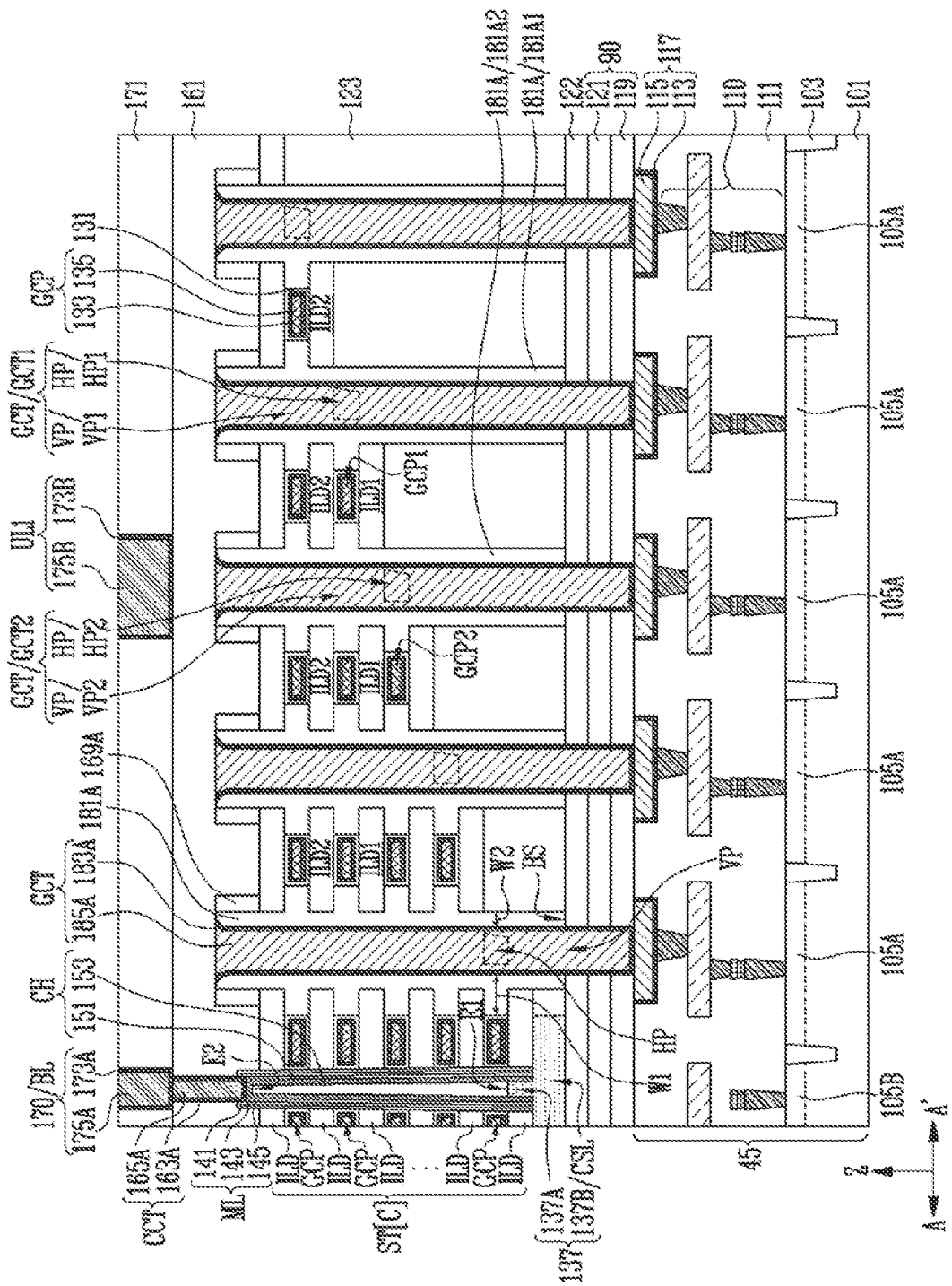
FIG. 6 is a sectional view of a semiconductor memory device taken along line A-A' shown in FIG. 5 in accordance with an embodiment of the present disclosure.

Referring to FIG. 5, the cell stack structures ST[C] may be isolated from each other by a slit SI. Each of the cell stack structures ST[C] may include gate conductive patterns GCP as shown in FIG. 6. The gate conductive patterns GCP may be stacked in the third direction Z to be spaced apart from each other as shown in FIG. 6. Each of the cell stack structures ST[C] may surround a channel structure CH extending in the third direction Z. FIG. 5 shows a single gate conductive pattern GCP of each of the cell stack structures ST[C].

A sidewall of the channel structure CH may be surrounded by a memory layer ML.

Each of the gate conductive patterns GCP may extend along the first direction X and the second direction Y.

Each of the gate conductive patterns GCP may be in contact with one of gate contact structures GCT. Each of the gate contact structures GCT may include a vertical part VP and a horizontal part HP extending from the vertical part VP.

The vertical part VP may extend in the third direction Z. Gaps G may be defined between vertical parts VP of the gate contact structures GCT and the gate conductive patterns GCP. In other words, the vertical parts VP of the gate contact structures GCT may be spaced apart from the gate conductive patterns GCP by the gaps G. Each of the gaps G may be filled with a gate spacer insulating layer 181A.

The horizontal part HP may be disposed at the same level as one of the gate conductive patterns GCP. The horizontal part HP may extend from the vertical part VP and penetrate the gate spacer insulating layer 181A. The horizontal part HP may extend in parallel to a sidewall of a gate conductive pattern GCP disposed at the same level as the horizontal part HP. A sidewall 180 of the horizontal part HP may be in contact with the gate conductive pattern GCP disposed at the same level as the horizontal part HP. The horizontal part HP may be in contact with the gap fill insulating layer 123. The horizontal part HP may be disposed between the gap fill insulating layer 123 and the gate conductive pattern GCP disposed at the same level as the horizontal part HP. The gate spacer insulating layers 181A may extend between the gap fill insulating layer 123 and the vertical part VP.

FIG. 6 is a sectional view of a semiconductor memory device taken along line A-A' shown in FIG. 5 in accordance with an embodiment of the present disclosure.

Referring to FIG. 6, the semiconductor memory device may include a peripheral circuit layer 45, a bonding structure 90 disposed on the peripheral circuit layer 45, a channel structure CH disposed on the bonding structure 90, a cell stack structure ST[C] penetrated by the channel structure CH on the bonding structure 90, a memory layer ML disposed between the cell stack structure ST[C] and the channel structure CH, and gate contact structures GCT penetrating the bonding structure 90.

The peripheral circuit layer 45 may include a substrate 101, interconnection structures 110 disposed on the substrate 101, and conductive pads 117 connected to the interconnection structures 110. The substrate 101 may include active regions divided by isolation layers 103. The substrate 101 may include a semiconductor substrate such as a silicon substrate or a germanium substrate. Impurity regions 105A and 105B doped with at least one of a p-type impurity and an n-type impurity may be defined in the active regions of the substrate 101. The impurity regions 105A and 105B may include impurity regions 105A used as junctions of the pass transistors PT shown in FIG. 4. Each of the interconnection structures 110 may include a conductive line, a contact plug, and a contact pad. Each of the conductive pads 117 may include a conductive barrier layer 113 and a metal layer 115.

The substrate 101 of the peripheral circuit layer 45 may be covered by an insulating structure 111. The interconnection structures 110 and the conductive pads 117 may be buried in the insulating structure 111. The insulating structure 111 may include multi-layered insulating layers each having two or more layers.

The bonding structure 90 may be disposed on the insulating structure 111 and the conductive pads 117. The bonding structure 90 may include a first insulating layer 121 and a second insulating layer 119, which are bonded to face each other. In accordance with the present disclosure, the gate contact structures GCT extend to penetrate the bonding structure 90, to be in contact with the conductive pads 117 of the peripheral circuit layer 45. Accordingly, in the present disclosure, the peripheral circuit layer 45 may be electrically connected to the gate contact structures GCT, even when the bonding structure 90 is not formed in a hybrid bonding structure including bonding between insulating layers and bonding between metal layers but simply formed in a bonding structure between the first insulating layer 121 and the second insulating layer 119.

The memory layer ML may include a tunnel insulating layer 145 surrounding the channel structure CH, a data storage layer 143 surrounding the tunnel insulating layer 145, and a first blocking layer 141 surrounding the data storage layer 143. The data storage layer 143 may be formed of a material layer capable of storing data changed using Fowler-Nordheim tunneling. In an embodiment, the data storage layer 143 may include a charge trap nitride layer. The first blocking insulating layer 141 may include an oxide layer capable of blocking charges. The tunnel insulating layer 145 may include a silicon oxide layer through which charges can tunnel.

The channel structure CH may further protrude in the third direction Z than the cell stack structure ST[C]. The channel structure CH may include a channel layer 151 and a core insulating layer 153. The channel layer 151 may surround a sidewall of the core insulating layer 153.

The core insulating layer 153 may include a first end portion E1 facing the peripheral circuit layer 45 and a second end portion E2 facing in a direction opposite to that of the first end portion E1. The channel layer 151 may extend along a surface of the second end portion E2 to close the second end portion E2.

The channel layer 151 may be used as a channel region of a memory cell string. The channel layer 151 may include a semiconductor layer. In an embodiment, the channel layer 151 may include silicon. The channel layer 151 may further protrude toward the peripheral circuit layer 45 than the core insulating layer 153.

The channel layer 151 may be connected to a doped semiconductor layer 137 and an upper conductive layer 170. The doped semiconductor layer 173 may be disposed between the bonding structure 90 and the channel structure CH. The doped semiconductor layer 137 may include a first pattern 137A and a second pattern 137B. The upper conductive layer 170 may overlap with the doped semiconductor layer 137 with the channel structure CH interposed therebetween. The upper conductor layer 170 may include a conductive barrier layer 173A and a metal layer 175A. The conductive barrier layer 173A may extend along a sidewall and a bottom surface of the metal layer 175A.

The first pattern 137A may be disposed between the core insulating layer 153 and the second pattern 137B, and the channel layer 151 may extend to surround a sidewall of the first pattern 137A. The second pattern 1378 may extend between the bonding structure 90 and the cell structure ST[C] from the first pattern 137A. In an embodiment, the first pattern 137A and the second pattern 137B may include an n-type doped silicon layer.

The upper conductive layer 170 may be connected to the channel layer 151 via the channel contact structure CCT. The channel contact structure CCT may penetrate the memory layer ML to be in contact with the channel layer 151. The channel contact structure CCT may include a conductive barrier layer 163A and a metal layer 165A. The conductive barrier layer 163A of the channel contact structure CCT may be disposed between the channel layer 151 and the metal layer 165A of the channel contact structure CCT, and may extend along a sidewall of the metal layer 165A. In an embodiment, the conductive barrier layer 163A may include titanium and titanium nitride, which may provide an ohmic contact.

A portion of the channel layer 151, which is in contact with the doped semiconductor layer 137, and a portion of the channel layer 151, which is in contact with the channel contact structure CCT, may be doped with an impurity. In an embodiment, the portion of the channel layer 151, which is in contact with the doped semiconductor layer 137, and the portion of the channel layer 151, which is in contact with the channel contact structure CCT, may be doped with an n-type impurity.

The second pattern 137B of the doped semiconductor layer 137 may be used as a common source line CSL. Although a structure corresponding to the embodiment shown in FIG. 3A is shown as an example in FIG. 6, the present disclosure is not limited thereto. In an embodiment, the second pattern 137B of the doped semiconductor layer 137 may be replaced with a conductive pattern for the bit line BL shown in FIG. 3B, and the upper conductive layer 170 may be defined as a conductive pattern for the common source line CSL shown in FIG. 3B.

Gate conductive patterns GCP and interlayer insulating layers ILD of the cell stack structure ST[C] may surround the channel structure CH and may extend toward the gate contact structures GCT. The gate conductive patterns GCP are disposed between the interlayer insulating layers ILD adjacent to each other in the third direction Z, to be insulated from each other by the interlayer insulating layers ILD. The gate conductive patterns GCP may be used as the source select line SSL, the drain select line DSL, and the word lines WL, which are described with reference to FIG. 4.

The gate conductive patterns GCP may include various conductive materials. In an embodiment, each of the gate conductive patterns GCP may include a conductive barrier layer 133 and a metal layer 135. The conductive barrier layer 133 may extend along a top surface and a bottom surface of the metal layer 135, which face the interlayer insulating layers ILD, and sidewalls of the metal layer 135, which face the channel structure CH and the gate contact structures GCT.

A second blocking insulating layer 131 may be formed between each of the gate conductive patterns GCP and the memory layer ML. The second blocking insulating layer 131 may have a higher dielectric constant than the first blocking layer 141. In an embodiment, the second blocking insulating layer 131 may include an aluminum oxide layer. The second blocking layer 131 may extend between the gate conductive patterns GCP and the interlayer insulating layers ILD and between the gate conductive patterns GCP and gate spacer insulating layers 181A. However, the present disclosure is not limited thereto. In an embodiment, the second blocking insulating layer 131 may extend along a sidewall of the memory layer ML.

The cell stack structure ST[C] may include a step structure. A gap fill insulating layer 123 may be disposed between the step structure of the cell stack structure ST[C] and the bonding structure 90. The gap fill insulating layer 123 may cover the step structure of the cell stack structure ST[C], and may extend up to a level at which the common source line CSL is disposed. An oxide layer 122 may be disposed between the gap fill insulating layer 123 and the bonding structure 90, and may extend to overlap with the cell stack structure ST[C].

The gate conductive patterns GCP may be respectively connected to the gate contact structures GCT. Each of the gate contact structures GCT may include a conductive barrier layer 183A and a metal layer 185A.

Vertical parts VP of the gate contact structures GCT may be respectively in contact with the conductive pads 117 overlapping with the vertical parts VP, and may extend in the third direction Z to penetrate the bonding structure 90, the oxide layer 122, and the gap fill insulating layer 123. The vertical parts VP may further protrude in the third direction Z than the cell stack structure ST[C]. Sidewalls of the vertical parts VP may be surrounded by the gate spacer insulating layers 181A. The vertical parts VP may further protrude toward the conductive pads 117 than the gate spacer insulating layers 181A.

The gate spacer insulating layers 181A may include bottom surfaces BS which face the peripheral circuit layer 145 and overlap with the bonding structure 90. The oxide layer 122 may extend between each of the bottom surfaces of the gate spacer insulating layers 181A and the bonding structure 90. The gate spacer insulating layers 181A may protrude toward the gate conductive patterns GCP to fill gaps between the interlayer insulating layers ILD. The gate spacer insulating layers 181A may further protrude in the third direction Z than the cell stack structure ST[C].

In an embodiment, a first insulating pattern 169A may be disposed on the cell stack structure ST[C]. The first insulating pattern 169A may be formed on a sidewall of the gate spacer insulating layer 181A, which further protrudes in the third direction Z than the cell stack structure ST[C].

The vertical parts VP, the first insulating pattern 169A, and the cell stack structure ST[C] may be covered by a first upper insulating layer 161. The channel contact structure CCT may penetrate the first upper insulating layer 161.

A second upper insulating layer 171 may be disposed on the first upper insulating layer 161. The upper conductive layer 170 used as the bit line BL may penetrate the second upper insulating layer 171. The second upper insulating layer 171 may be penetrated by a first upper line UL1 spaced from the bit line BL, and the first upper line UL1 may overlap with some of the gate contact structures GCT. The first upper line UL1 may include the same conductive material as the upper conductive layer 170. In an embodiment, the first upper line UL1 may include a conductive barrier 173B and a metal layer 175B.

The gate conductive patterns GCP may be spaced apart from the vertical parts of the gate contact structures GCT by the gate spacer insulating layers 181A. The gate conductive patterns GCP extend more distant from the channel structure CH as becoming more distant from the peripheral circuit layer 45, thereby forming a step structure. Horizontal parts HP of the gate contact structures GCT may have sidewalk 180 being in contact with sidewalls of the gate conductive patterns GCP as shown in FIG. 5.

For example, the gate conductive patterns GCP may include a first gate conductive pattern GCP1 on the bonding structure 90 and a second gate conductive pattern GCP2 between the first gate conductive pattern GCP1 and the bonding structure 90. The gate contact structures GCT may include a first gate contact structure GCT1 connected to the first gate conductive pattern GCP1 and a second gate contact structure GCT2 connected to the second gate conductive pattern GCP2.

The first gate conductive pattern GCP1 and the second gate conductive pattern GCP2 may surround the channel structure CH and may extend toward the first gate contact structure GCT1 and the second gate contact structure GCT2. The first gate conductive pattern GCP1 may further protrude toward the first gate contact structure GCT1 than the second gate conductive pattern GCP2. Accordingly, the first gate conductive pattern GCP1 may include a region overlapping with the second gate conductive pattern GCP2 and a region not overlapping with the second gate conductive pattern GCP2. Also, a step structure may be defined by the first gate conductive pattern GCP1 and the second gate conductive pattern GCP2.

The first gate contact structure GCT1 may face the step structure defined by the first gate conductive pattern GCP1 and the second gate conductive pattern GCP2. The second gate contact structure GCT2 may be disposed between the second gate conductive pattern GCP2 and the first gate contact structure GCT1.

A first vertical part VP1 of the first gate contact structure GCT1 may extend in parallel to the channel structure CH. The first vertical part VP1 may extend in the third direction Z to penetrate the bonding structure 90, the oxide layer 122, and the gap fill insulating layer 123 from one conductive pad 117 overlapping the first vertical part VP1. A first horizontal part HP1 of the first gate contact structure GCT1 may extend from the first vertical part VP1 at a level at which the first gate conductive pattern GCP1 is disposed, and may extend to intersect the first vertical part VP1.

A second vertical part VP2 of the second gate contact structure GCT2 may extend in parallel to the channel structure CH. The second vertical part VP2 may be disposed between the second gate conductive pattern GCP2 and the first vertical part VP1. The second vertical part VP2 may extend in the third direction Z to penetrate the bonding structure 90, the oxide layer 122, the gap fill insulating layer 123, and the first gate conductive pattern GCP1 from another conductive pad 117 overlapping with the second vertical part VP2. A second horizontal part HP2 of the second gate contact structure GCT2 may extend from the second vertical part VP2 at a level at which the second gate conductive pattern GCP2 is disposed, and may extend to intersect the second vertical part VP2.

The interlayer insulating layers ILD may include a first interlayer insulating layer ILD1 and a second interlayer insulating layer ILD2. Each of the first interlayer insulating layer ILD1 and the second interlayer insulating layer ILD2 may surround the channel structure CH, and may extend toward the second gate contact structure GCT2. The first interlayer insulating layer ILD1 may be disposed between the first gate conductive pattern GCP1 and the second gate conductive pattern GCP2, and the second interlayer insulating layer ILD2 may overlap with the first interlayer insulating layer ILD1 with the first gate conductive pattern GCP1 interposed therebetween. The second interlayer insulating layer ILD2 may further extend away from the channel structure CH than the first interlayer insulating layer ILD1.

Each of the gate spacer insulating layers 181A may be formed in an asymmetrical structure with respect to the horizontal part HP. For example, each of the gate spacer insulating layers 181A may have a first width W1 between the vertical part VP and the gate conductive pattern GCP, and have a second width W2 narrower than the first width W1 between the vertical part VP and the gap fill insulating layer 123.

In an embodiment, the gate spacer insulating layers 181A may include a first gate spacer insulating layer 181A1 and a second gate spacer insulating layer 181A2. The first gate spacer insulating layer 181A1 may surround a sidewall of the first vertical part VP1 of the first gate contact structure GCT1, and may be penetrated by the first horizontal part HP1 of the first gate contact structure GCT1. The second gate spacer insulating layer 181A2 may surround a sidewall of the second vertical part VP2 of the second gate contact structure GCT2, and may be penetrated by the second horizontal part HP2 of the second gate contact structure GCT2.

Each of the first gate spacer insulating layer 181A1 and the second gate spacer insulating layer 181A2 may protrude toward the first gate conductive pattern GCP1 to fill a gap between the first interlayer insulating layer ILD1 and the second interlayer insulating layer ILD2. The second gate spacer insulating layer 181A2 may protrude toward the second gate conductive pattern GCP2 between the second vertical part VP2 and the second gate conductive pattern GCP2.

Figure 7:
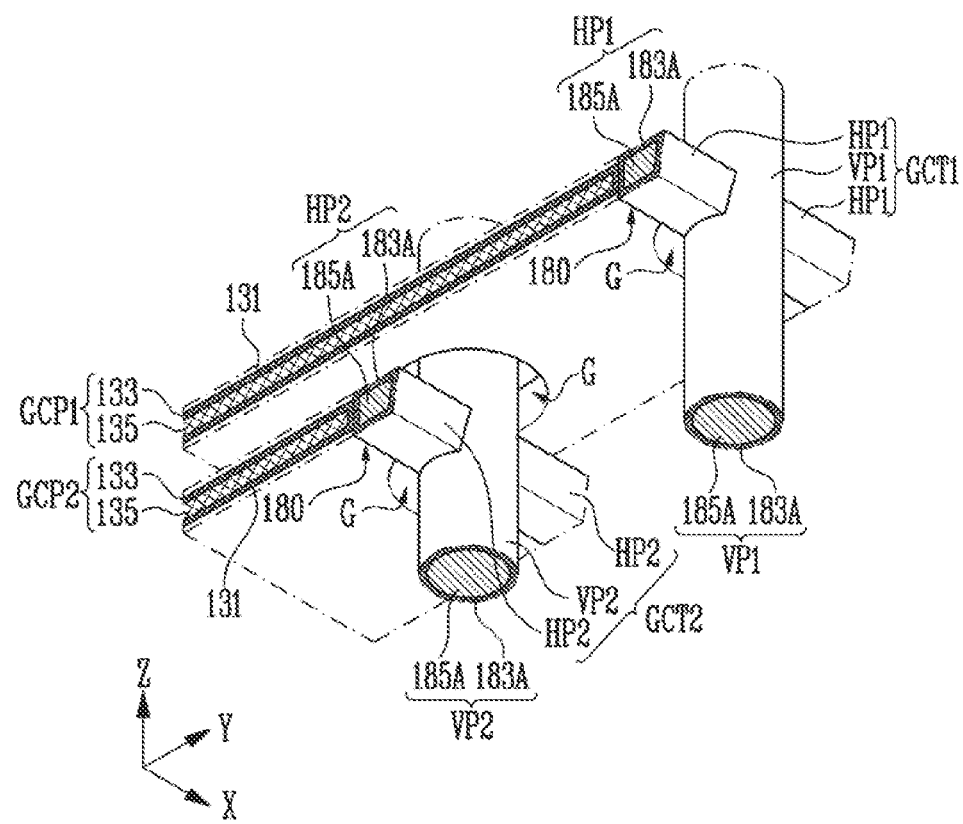
FIG. 7 is a perspective view illustrating first and second gate conductive patterns and first and second gate contact structures, which are shown in FIG. 6.

FIG. 7 is a perspective view illustrating the first and second gate conductive patterns GCP1 and GCP2 and the first and second gate contact structures GCT1 and GCT2, which are shown in FIG. 6.

Referring to FIG. 7, the first vertical part VP1 of the first gate contact structure GCT1 faces an end portion of the first gate conductive pattern GCP1, and may be spaced apart from the first gate conductive pattern GCP1. The second vertical part VP2 of the second gate contact structure GCT2 faces an end portion of the second gate conductive pattern GCP2, and may be spaced apart from the second gate conductive pattern GCP2. The second vertical part VP2 extends in the third direction Z to penetrate the first gate conductive pattern GCP1, and may be spaced apart from the first gate conductive pattern GCP1. Accordingly, gaps G may be defined between the first vertical part VP1 and the first gate conductive pattern GCP1, between the second vertical part VP2 and the first gate conductive pattern GCP1, and between the second vertical part VP2 and the second gate conductive pattern GCP2.

The first horizontal part HP1 of the first gate contact structure GCT1 may extend along a sidewall of the first gate conductive pattern GCP1 from the first vertical part VP1, and may be in contact with the sidewall of the first gate conductive pattern GCP1. The second horizontal part HP2 of the second gate contact structure GCT2 may extend along a sidewall of the second gate conductive pattern GCP2 from the second vertical part VP2, and may be in contact with the side all of the second gate conductive pattern GCP2.

In an embodiment, the first horizontal part HP1 and the second horizontal part HP2 may penetrate the second blocking insulating layer 131. The first horizontal part HP1 and the second horizontal part HP2 may have the sidewalls 180, respectively. The sidewalls 180 may be respectively in contact with the sidewall of the first gate conductive pattern GCP1 and the sidewall of the second gate conductive pattern GCP2.

In an embodiment, the conductive barrier layers 183A and 133 may form a common surface at each of a contact surface of the first horizontal part HP1 and the first gate conductive pattern GCP1 and a contact surface of the second horizontal part HP2 and the second gate conductive pattern GCP2.

Figure 8A:
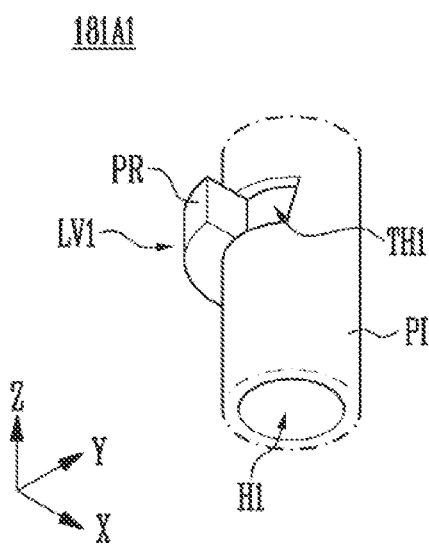
FIGS. 8A and 8B are perspective views illustrating first and second gate spacer insulating layers shown in FIG. 6.
Figure 8B:
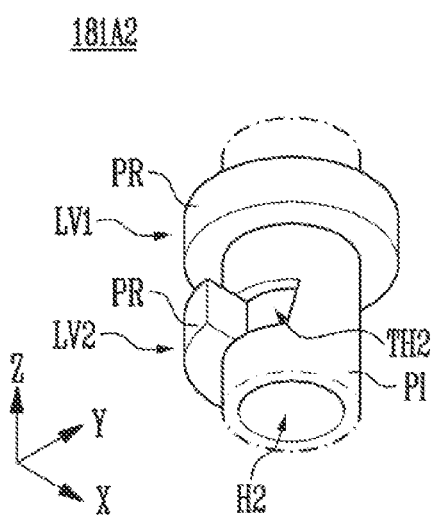

FIGS. 8A and 8B are perspective views illustrating the first and second gate spacer insulating layers 181A1 and 181A2 shown in FIG. 6.

Referring to FIGS. 8A and 8B, each of the first and second gate spacer insulating layers 181A1 and 181A2 may include a pillar part PI and one or more protrusion parts PR. In an embodiment, each of the gaps G as generally shown in FIG. 5 may include not only the pillar part PI but also the protrusion part PR that space the vertical part VP from the gate conducive pattern GCP.

Referring to FIG. 8A, a pillar part PI of the first gate spacer insulating layer 181A1 may extend in the third direction Z, and a first hole H1 may be defined in a central region of the pillar part PI. The first hole H1 may extend in the third direction Z, and may be filled with the first vertical part VP1 shown in FIG. 7.

The first gate spacer insulating layer 181A1 may include a protrusion part PR protruding from the pillar part PI at a first level LV1 at which the first gate conductive pattern GCP1 shown in FIG. 7 is disposed. The protrusion part PR of the first gate spacer insulating layer 181A1 may fill the gap G between the first vertical part VP1 and the first gate conductive pattern GCP1, shown in FIG. 7.

The first gate spacer insulating layer 181A1 may include a first through part TH1 penetrating the pillar part PI at the first level LV1. The first horizontal part HP1 shown in FIG. 7 may be inserted into the first through part TH1. The first gate spacer insulating layer 181A1 may be formed in an asymmetrical structure with respect to the first horizontal part HP1 shown in FIG. 7.

Referring to FIG. 8B, a pillar part PI of the second gate spacer insulating layer 181A2 may extend in the third direction Z, and a second hole H2 may be defined in a central region of the pillar part PI. The second hole H2 may extend in the third direction Z, and be filled with the second vertical part VP2 shown in FIG. 7.

The second gate spacer insulating layer 181A2 may include protrusion parts PR protruding from the pillar part PI at the first level LV1 and a second level Lv2 at which the second gate conductive pattern GCP2 shown in FIG. 7 is disposed. The protrusion parts PR of the second gate spacer insulating layer 181A2 may fill the gaps G between the second vertical part VP2 and the first gate conductive pattern GCP1 and between the second vertical part VP2 and the second gate conductive pattern GCP2, shown in FIG. 7.

The second gate spacer insulating layer 181A2 may include a second through part TH2 penetrating the pillar part PI at the second level LV2. The second horizontal part HP2 shown in FIG. 7 may be inserted into the second through part TH2. The second gate spacer insulating layer 181A2 may be formed in an asymmetric structure with respect to the second horizontal part HP2 shown in FIG. 7.

Figure 9:
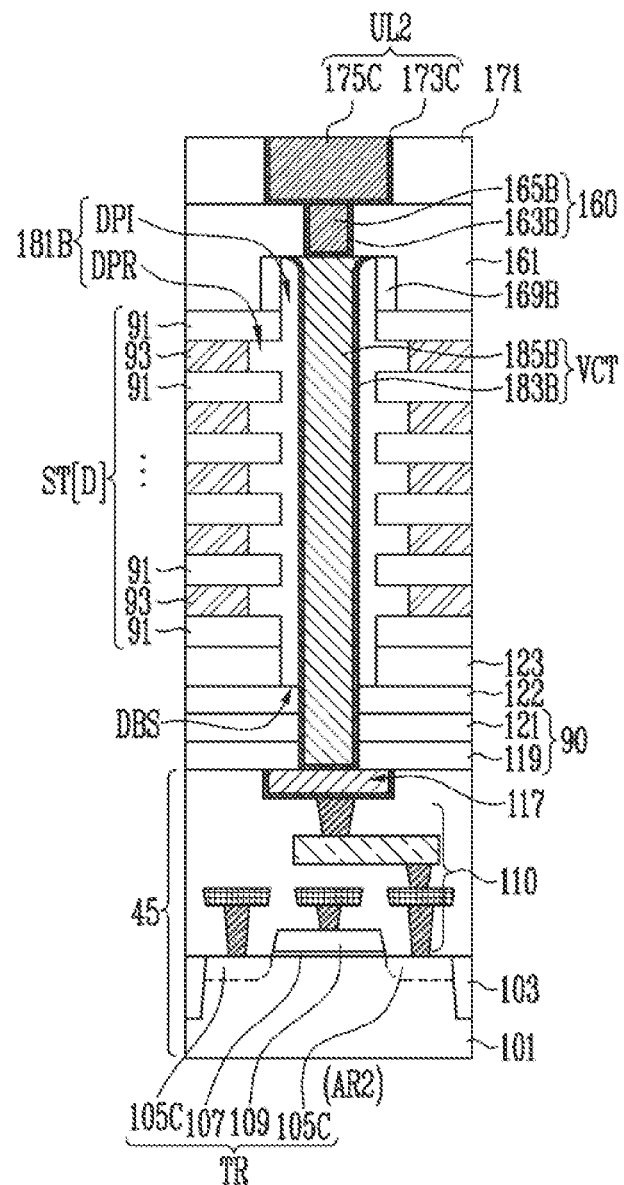
FIG. 9 is a sectional view illustrating a dummy stack structure and a vertical contact structure in accordance with an embodiment of the present disclosure.

FIG. 9 is a sectional view illustrating a dummy stack structure ST[D] and a vertical contact structure VCT in accordance with an embodiment of the present disclosure.

Referring to FIG. 9, the dummy stack structure ST[D] and the vertical contact structure VCT may be disposed on a second region AR2 of the peripheral circuit layer 45.

The first insulating layer 121 and the second insulating layer 119 may extend to overlap with the second region AR2 of the peripheral circuit layer 45. In an embodiment, a transistor TR may be disposed in the second region AR2 of the peripheral circuit layer 145. The transistor TR may be included in one of the other circuits of the peripheral circuit 40 except the row decoder 33 shown in FIG. 1. The transistor TR may include a gate insulating layer 107 and a gate electrode 109, which are stacked on the active regions of the substrate 101, and impurity regions 105C formed in the active region at both sides of the gate electrode 109. The active region may be divided by the isolation layers 103. The impurity regions 105C may be defined by doping at least one of a p-type impurity and an n-type impurity into the active region of the substrate 101. Some of the interconnection structures 110 may be connected to the transistor TR.

The dummy stack structure ST[D] may overlap with the second region AR2 of the peripheral circuit layer 45. The dummy stack structure ST[D] may include first material layers 91 and second material layers 93, which are alternately stacked on the bonding structure 90. The first material layers 91 may be substantially disposed at the same levels as the interlayer insulating layers ILD shown in FIG. 6, and include the same material as the interlayer insulating layers ILD. The second material layers 93 may be substantially disposed at the same levels as the gate conductive patterns GCP shown in FIG. 6. In an embodiment, the second material layers 93 may be formed of an insulating material having an etch selectivity with respect to the first material layers 91. In an embodiment, the first material layers 91 may include an oxide layer, and the second material layers 93 may include a nitride layer. However, the present disclosure is not limited thereto. In an embodiment, the second material layers 93 may be formed of the same conductive material as each of the gate conductive patterns GCP described with reference to FIG. 6.

The gap fill insulating layer 123 and the oxide layer 122 may extend between the dummy stack structure ST[D] and the bonding structure 90.

The vertical contact structure VCT may penetrate the dummy stack structure ST[D], the gap fill insulating layer 123, the oxide layer 122, and the bonding structure 90 and may be connected to the peripheral circuit layer 45. In an embodiment, the vertical contact structure VCT may extend to be in contact with one conductive pad 117 overlapping with the vertical contact structure VCT, and may be connected to the transistor TR via the conductive pad 117.

In accordance with an embodiment of the present disclosure, the vertical contact structure VCT may extend to penetrate the bonding structure 90, and may be in direct contact with the conductive pad 117 of the peripheral circuit layer 45. Accordingly, in the present disclosure, the vertical contact structure VCT may be electrically connected to the peripheral circuit layer 45, even when the bonding structure 90 is simplified as a bonding structure between the first insulating layer 121 and the second insulating layer 119.

The vertical contact structure VCT may include the same conductive material as the gate contact structure GCT shown in FIG. 6. In an embodiment, the vertical contact structure VCT may include a conductive barrier layer 183B and a metal layer 185B.

The vertical contact structure VCT may be connected to a second upper line UL2 via a via plug 160. The first upper insulating layer 161 and the second upper insulating layer 171 may extend to cover the vertical contact structure VCT and the dummy stack structure ST[D].

The via plug 160 penetrates the first upper insulating layer 161, to connect the vertical contact structure VCT and the second upper line UL2. The via plug 160 may include the same conductive material as the channel contact structure CCT shown in FIG. 6. In an embodiment, the via plug 160 may include a conductive barrier layer 163B and a metal layer 165B.

The second upper line UL2 may penetrate the second upper insulating layer 171 and may be connected to the via plug 160. The second upper line UL2 may include the same conductive material as the first upper line UL1 shown in FIG. 6. In an embodiment, the second upper line UL2 may include a conductive barrier layer 173C and a metal layer 175C.

A sidewall of the vertical contact structure VCT may be surrounded by a dummy spacer insulating layer 181B. Accordingly, the vertical contact structure VCT may be insulated from the second material layers 93 by the dummy spacer insulating layer 181B, even when the second material layers 93 are formed of a conductive material.

The vertical contact structure VCT may further extend toward the peripheral circuit layer 45 than the dummy spacer insulating layer 181B, and may include a sidewall in contact with the bonding structure 90.

The dummy spacer insulating layer 181B may include a dummy pillar part DPI and dummy protrusion parts DPR. The dummy pillar part DPI may include a bottom surface DBS which faces the peripheral circuit layer 45 and overlaps with the bonding structure 90. The dummy protrusion parts DPR may protrude toward the second material layers 93 to fill spaces between the first material layers 91.

The dummy pillar part DPI of the dummy spacer insulating layer 181B and the vertical contact structure VCT may further protrude in the third direction Z than the dummy stack structure ST[D]. In an embodiment, a second insulating pattern 169B may be disposed on the dummy stack structure ST[D]. The second insulating pattern 169B may be formed on a sidewall of the dummy pillar part DPI, which further protrudes in the third direction Z than the dummy stack structure ST[D].

Hereinafter, a manufacturing method of a semiconductor memory device in accordance with an embodiment of the present disclosure will be described.

FIGS. 10A, 10B, 10C, 10D, 10E, and 10F are process sectional views illustrating a process of forming a step structure in accordance with an embodiment of the present disclosure.

Figure 10A:
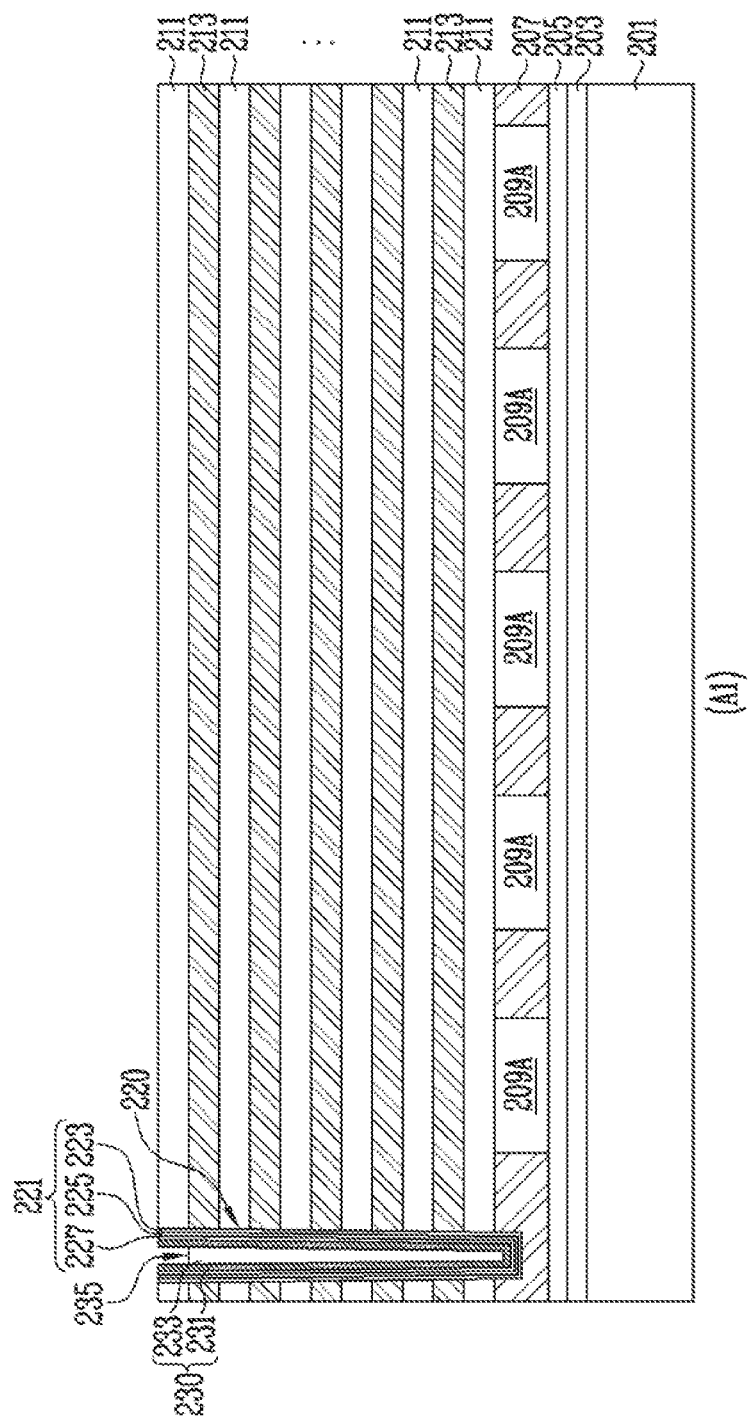

Referring to FIG. 10A, a first protective layer 203 and a second protective layer 205 may be sequentially stacked on a sacrificial substrate 201 including a first region A1. The first protective layer 203 may be formed of a material which may serve as a barrier in a subsequent process of removing the sacrificial substrate 201. The second protective layer 205 may be formed of a material different from that of the first protective layer 203. In an embodiment, the sacrificial substrate 201 may include silicon, the first protective layer 203 may include nitride, and the second protective layer 205 may include oxide.

Subsequently, a third protective layer 207 including first insulating patterns 209A may be formed on the second protective layer 205. Subsequently, first material layers 211 and second material layers 213 may be alternately stacked on the third protective layer 207.

The first insulating patterns 209A may be formed of the same material as the second protective layer 205. In an embodiment, the first insulating patterns 209A may include oxide. The third protective layer 207 may be formed of a material which may serve as an etch stop layer in a subsequent process of etching the first material layers 211 and the second material layers 213. The third protective layer 207 may include silicon.

The second material layers 213 may include a material having an etch selectivity with respect to the first material layers 211. The first material layers 211 may be formed of an insulating material capable of insulating between gate conductive patterns. In an embodiment, the first material layers 211 may include an oxide layer such as silicon oxide, and the second material layers 213 may include a nitride layer such as silicon nitride.

Subsequently, a channel hole 220 penetrating the first material layers 211 and the second material layers 213 may be formed by etching the first material layers 211 and the second material layers 213. The third protective layer 207 may serve as an etch stop layer during the etching process of the first material layers 211 and the second material layers 213 to form the channel hole 220. After the first material layers 211 and the second material layers 213 are etched, the channel hole 220 may extend to the inside of the third protective layer 207 by etching a portion of the third protective layer 207.

Subsequently, the channel hole 220 may be filled with a memory layer 221 and a channel structure 230. The memory layer 221 may be formed by sequentially stacking the first blocking insulating layer 223, a data storage layer 225, and a tunnel insulating layer 227 on a surface of the channel hole 220. A process of forming the channel structure 230 may include a process of forming a channel layer 231 on a surface of the memory layer 221, a process of filling a central region of the channel hole 220, which is opened by the channel layer 231, with a core insulating layer 233, and a process of removing a portion of the core insulating layer 233 such that a recess region 235 is defined on the top of the core insulating layer 233. The channel layer 231 may include a semiconductor layer which can be used a channel region of a memory string.

The channel structure 230 may penetrate the first material layers 211 and the second material layers 213, be spaced apart from the first material layers 211 and the second material layers 213 by the memory layer 221.

Figure 10B:
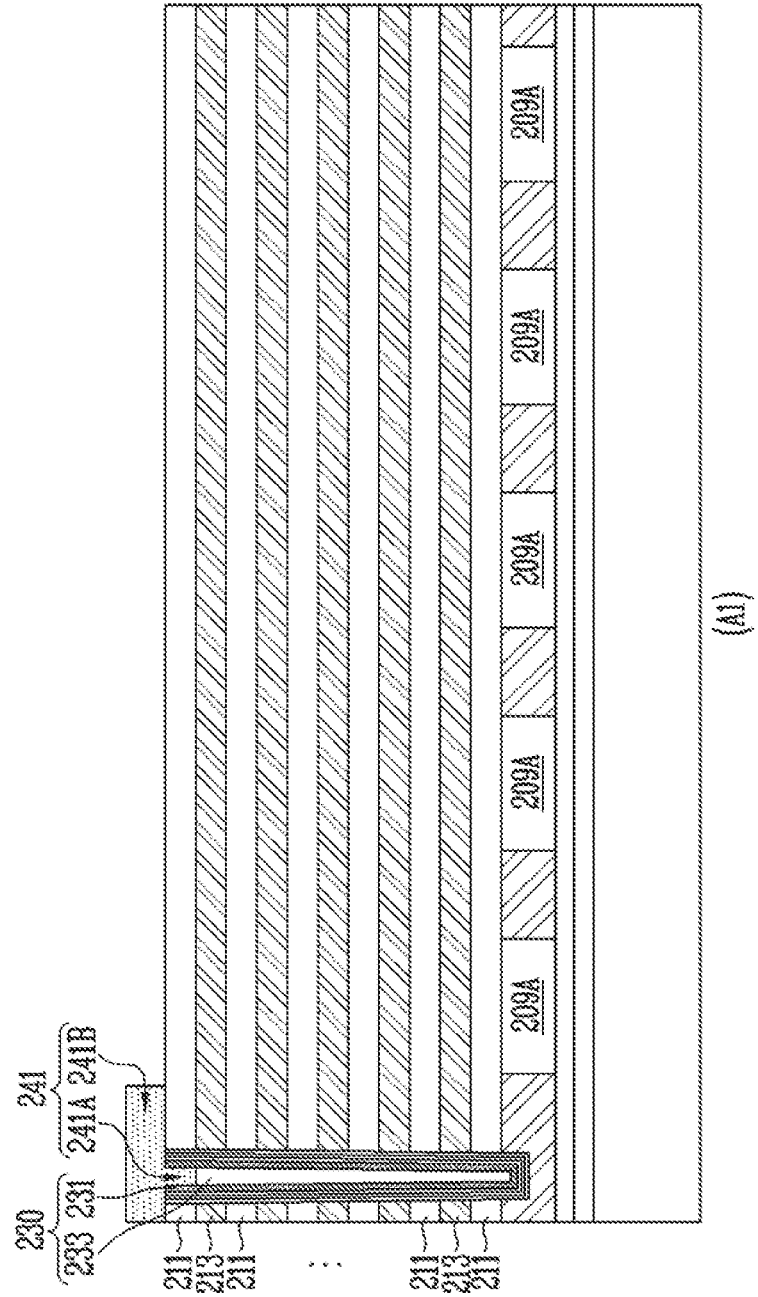

Referring to FIG. 10B, a doped semiconductor layer 241 connected to the channel structure 230 may be formed. The doped semiconductor layer 241 may include a first pattern 241A filling the recess region 235 shown in FIG. 10A and a second pattern 241B extending from the first pattern 241A. The second pattern 241B may extend to cover a stacked structure comprising the first material layers 211 and the second material layers 213. A portion of the doped semiconductor layer 241 may be etched to expose a portion of the stacked structure comprising the first material layers 211 and the second material layers 213, which overlap with the first insulating patterns 209A. In an embodiment, the doped semiconductor layer 241 may be etched as a pattern for the common source line CSL shown in FIG. 3.

Referring to FIG. 10C, a preliminary structure 210A may be formed by etching the first material layers 211 and the second material layers 213, which are exposed by the doped semiconductor layer 241. The preliminary step structure 210A may include a plurality of steps ST. Each step ST may include one second material layer 213 and one first material layer 211 on the second material layer 213. Sidewalls of the steps ST may respectively overlap with the first insulating patterns 209A.

Referring to FIG. 10D, a portion of each of the second material layers 213 may be selectively etched from a sidewall of the preliminary step structure 210A. Accordingly, first gaps 215 may be defined between the first material layers 211. The first gaps 215 may respectively overlap with the first insulating patterns 209A.

Figure 10E:
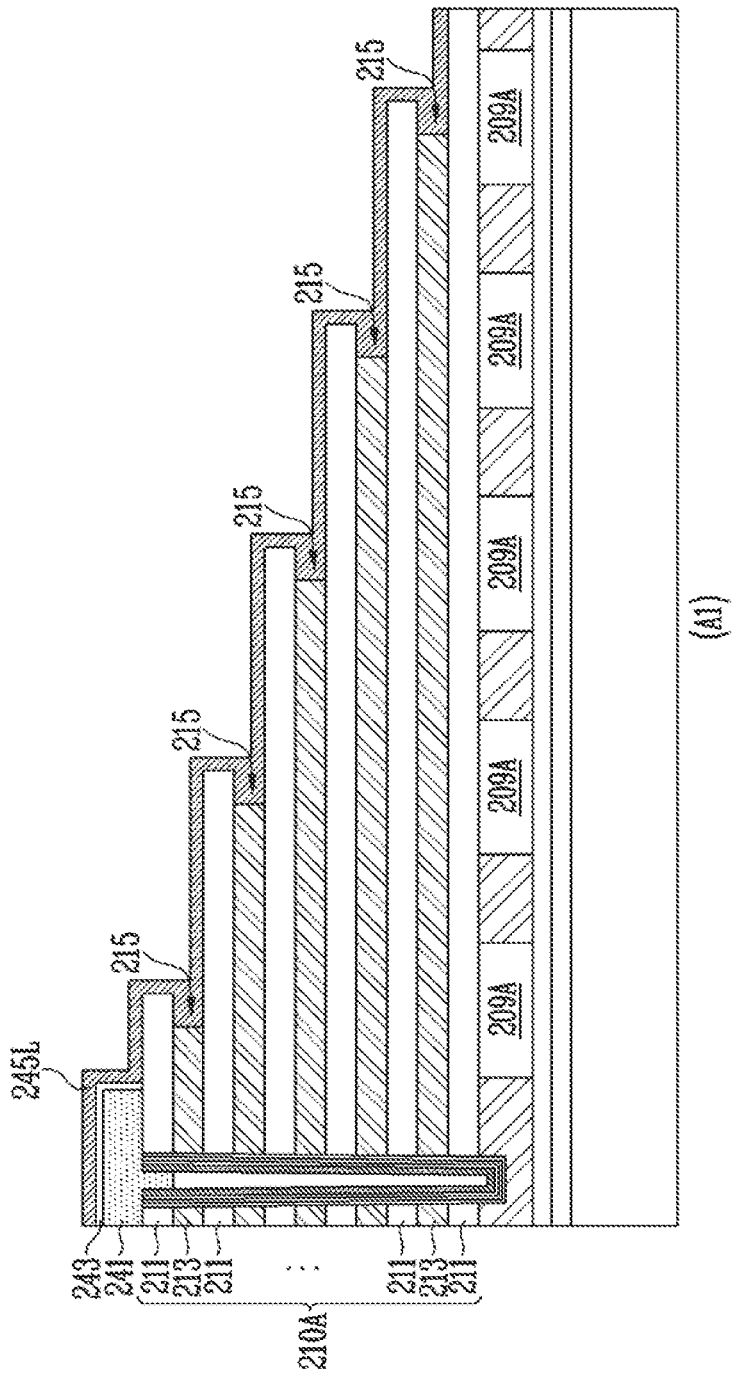

Referring to FIG. 10E, a liner layer 243 may be formed along a surface of the doped semiconductor layer 241. The liner layer 243 may be native oxide, or be oxide formed through an oxidation process.

Subsequently, a gap fill layer 245L may be formed, which fills the first gaps 215. The gap fill layer 245L may include a material having an etching resistance with respect to an etching material for selectively removing the second material layers 213. In an embodiment, the second material layers 213 formed of a nitride layer may be selectively removed by using a phosphoric acid, and the gap fill layer 245L may include a material having a high etching resistance with respect to the phosphoric acid, as compared with the nitride layer. In an embodiment, the gap fill layer 245L may include any one of silicon, metal, a titanium nitride layer (TiN), and a silicon carbon nitride layer (SiCN).

Referring to FIG. 10F, a portion of the gap fill layer 245L may be etched through an etch-back process such that the gap fill layer 245L shown in FIG. 10E is separated into gap fill patterns 245. Accordingly, a step structure 217 may be defined.

The gap fill patterns 245 may remain in respectively the first gaps 215 shown in FIG. 10E. The gap fill patterns 245 may respectively overlap with the first insulating patterns 209A.

During the etching process for the gap fill patterns 245, the doped semiconductor layer 241 may be protected by the liner layer 243. The liner layer 243 may be removed after the gap fill patterns 245 are formed.

Figure 11:
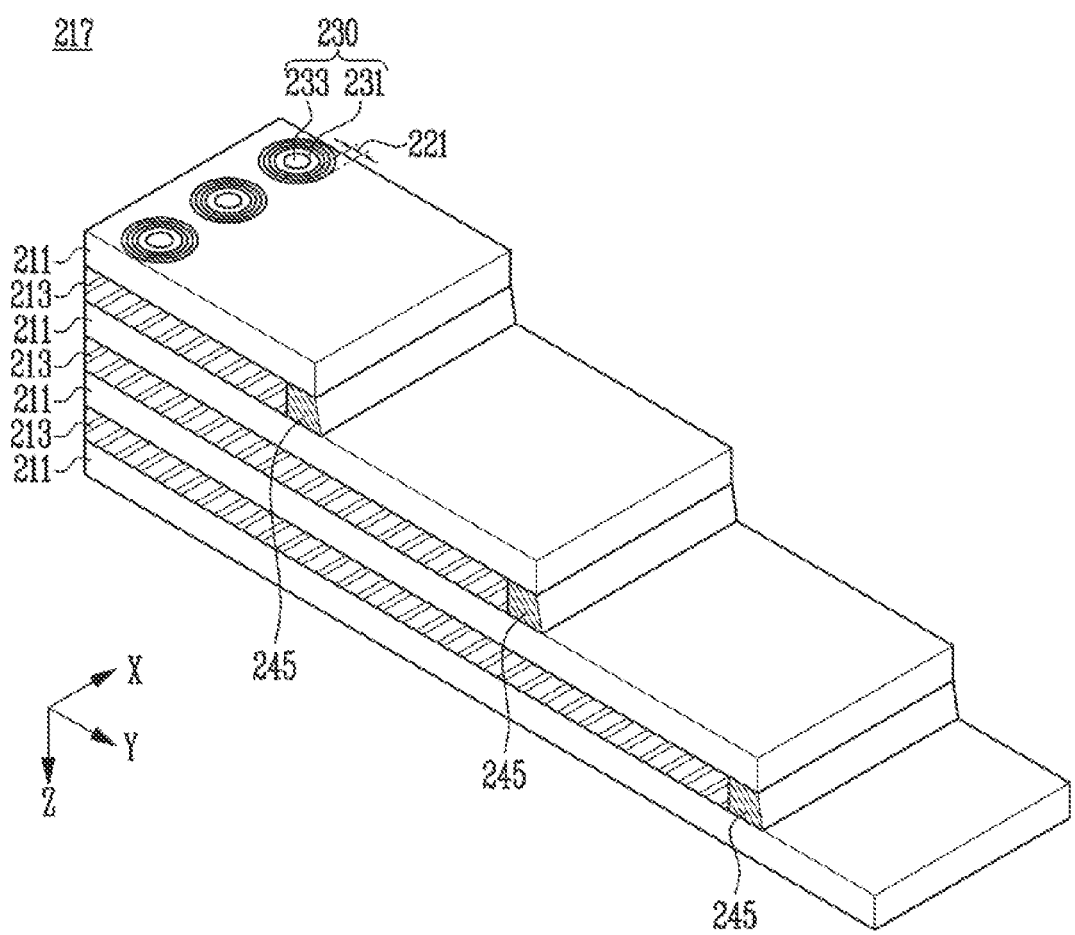
FIG. 11 is a perspective view illustrating a portion of the step structure shown in FIG. 10F.

FIG. 11 is a perspective view illustrating a portion of the step structure 217 shown in FIG. 10F.

Referring to FIG. 11, the step structure 217 may include first material layers 211 stacked to be spaced apart from each other, second material layers 213 disposed between the first material layers 211, and gap fill patterns 245 disposed on sidewalls of the second material layers 213.

Each of the first material layers 211 and the second material layers 213 may extend in the first direction X and the second direction Y to surround the channel structure 230 and the memory layer 221. The first material layers 211 and the second material layers 213 may extend toward the gap fill patterns 245.

The gap fill patterns 245 may respectively in contact with the sidewalk of the second material layers 213, and may extend in parallel to the sidewalls of the second material layers 213. The gap fill patterns 245 may be disposed between the first material layers 211.

Figure 12:
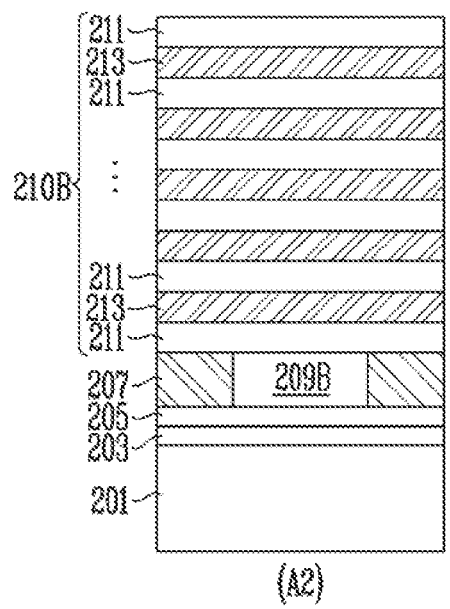
FIG. 12 is a sectional view illustrating a dummy stack structure in accordance with an embodiment of the present disclosure.

FIG. 12 is a sectional view illustrating a dummy stack structure 210B in accordance with an embodiment of the present disclosure.

Referring to FIG. 12, the sacrificial substrate 210 may include a second region A2 in addition to the first region A1 shown in FIGS. 10A and 10F. The first protective layer 203, the second protective layer 205, a third protective layer 207, the first material layers 211, and the second material layers 213 may extend onto the second region A2 of the sacrificial substrate 210.

The third protective layer 207 on the second region A2 of the sacrificial substrate 201 may be penetrated by a second insulating pattern 209B. The second insulating pattern 209B may be formed of the same material as the first insulating pattern 209A shown in FIG. 10A.

The doped semiconductor layer 241 shown in FIG. 10B may be removed on the second region of the sacrificial substrate 201.

The first material layers 211 and the second material layers 213, which are alternately stacked on the second region A2 of the sacrificial substrate 201, may form the dummy stack structure 210B. The dummy stack structure 210B may be protected by a mask pattern (not shown) while the processes shown in FIGS. 10C to 10F are performed. The mask pattern may be removed after the process shown in FIG. 10F is completed.

FIGS. 13A, 13B, 14A, and 14B are process sectional views illustrating a process of forming contact holes in accordance with an embodiment of the present disclosure.

Figure 13A:
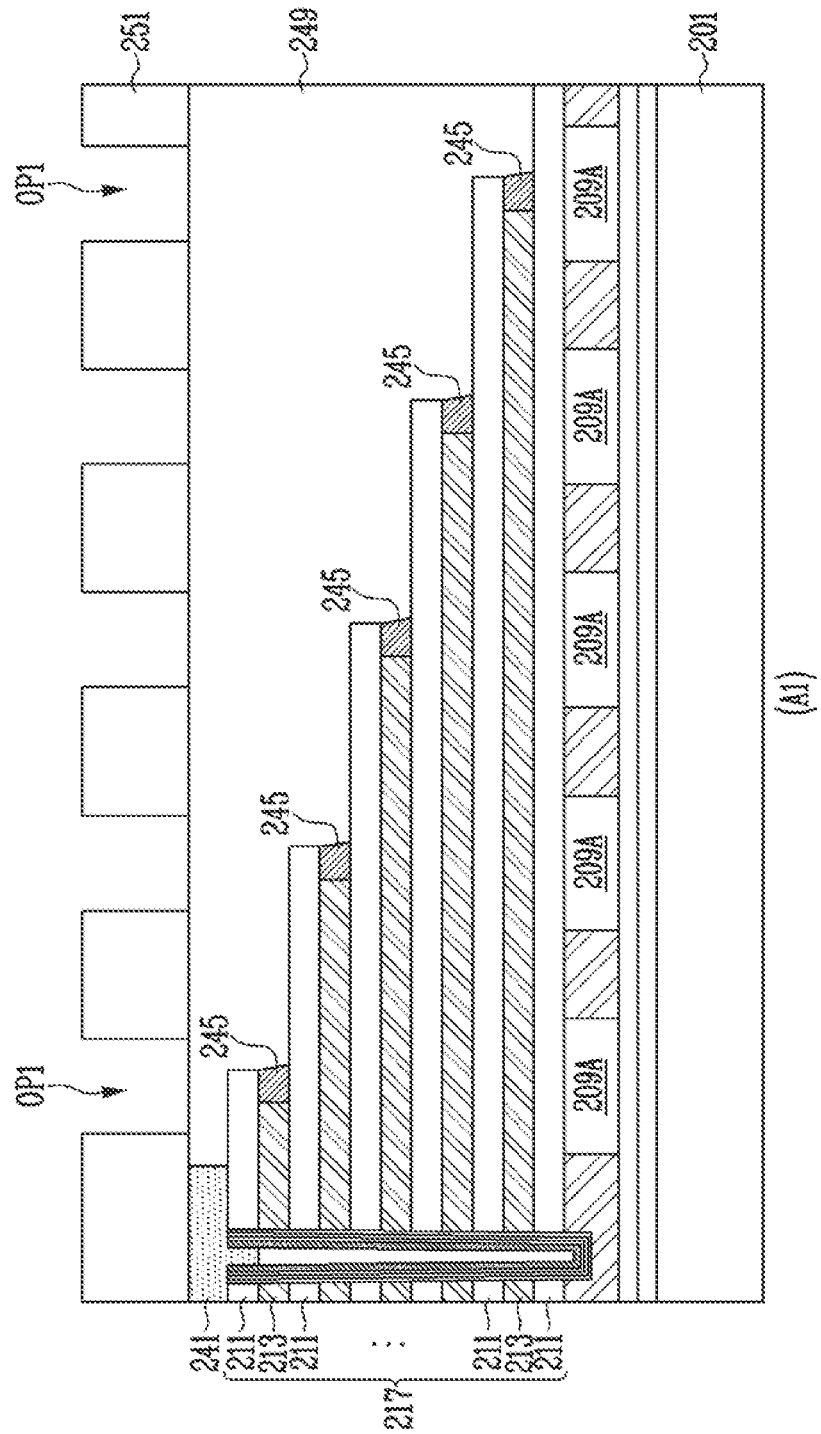
FIGS. 13A, 13B, 14A, and 14B are process sectional views illustrating a process of forming contact holes in accordance with an embodiment of the present disclosure.
Figure 13B:
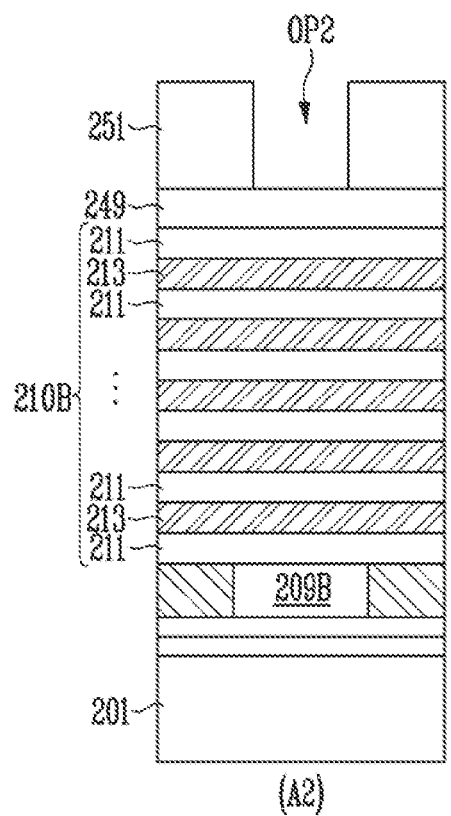

Referring to FIGS. 13A and 13B, a gap fill insulating layer 249 may be formed to cover the step structure 217 and the dummy stack structure 210B. The gap fill insulating layer 249 may be planarized such that a top surface of the gap fill insulating layer 249 is located at a level at which a top surface of the doped semiconductor layer 241 is disposed. The gap fill insulating layer 249 may include oxide.

Subsequently, a mask pattern 251 may be formed on the gap fill insulating layer 249. The mask pattern 251 may include first openings OP1 and a second opening OP2. The first openings OP1 may respectively overlap with the gap fill patterns 245, and respectively overlap with the first insulating patterns 209A. The second opening OP2 may overlap with the second insulating pattern 209B.

Figure 14A:
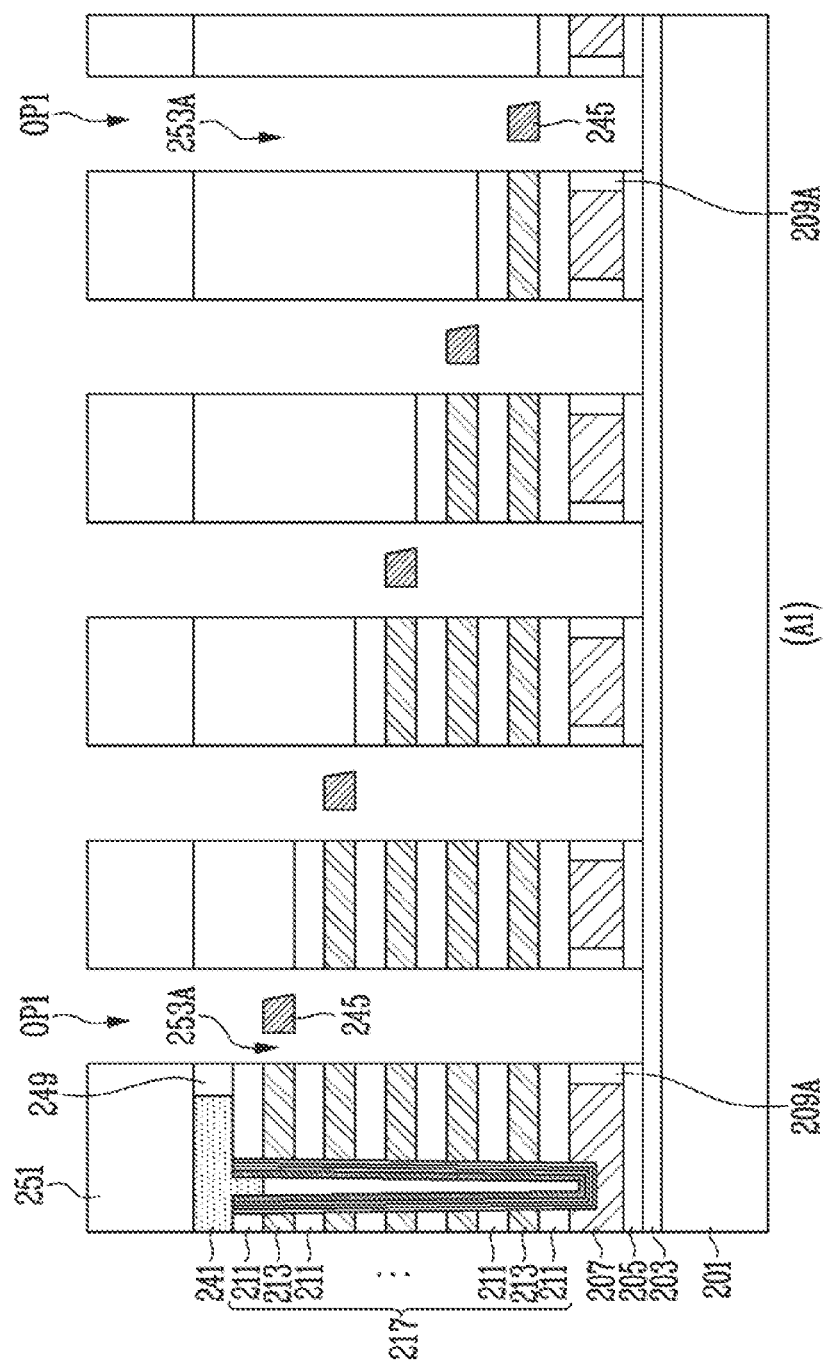
Figure 14B:
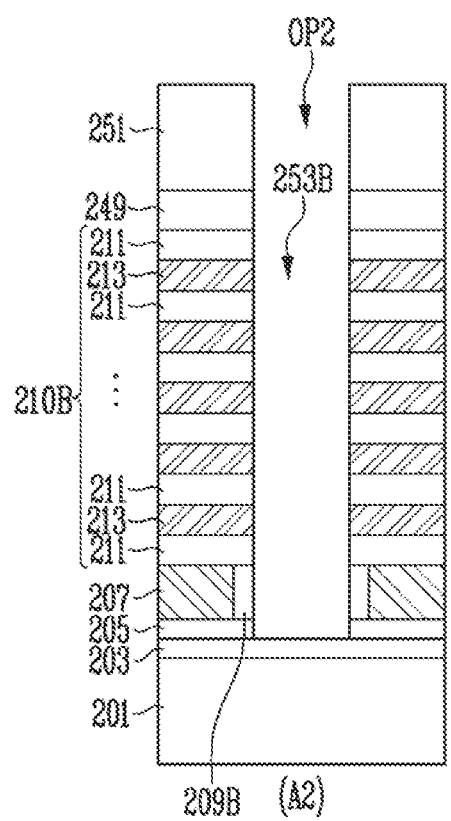

Referring to FIGS. 14A and 14B, contact holes 253A and 253B may be formed by etching the gap fill insulating layer 249, the first material layers 211, the second material layers 213, the first insulating patterns 209A, and the second insulating pattern 209B, which are exposed through the first openings OP1 and the second opening OP2. The contact holes 253A and 253B may penetrate the second protective layer 205 and may expose the first protective layer 203. Because the gap fill patterns 245 is formed of a material having an etch selectivity with respect to the gap fill insulating layer 249, the first material layers 211, the second material layers 213, the first insulating patterns 209A, the second insulating pattern 209B, and the second protective layer 205, the gap fill patterns 245 are not removed but may remain.

The contact holes 253A and 253B may include first contact holes 253A overlapping with the first region A1 of the sacrificial substrate 201 and a second contact hole 253B overlapping with the second region A2 of the sacrificial substrate 201. The first contact holes 253A may be defined by the first openings OP1, and may respectively expose the gap fill patterns 245. The first contact holes 253A may respectively penetrate the first insulating patterns 209A. The second contact hole 253B may be defined by the second opening OP2, and penetrate the second insulating pattern 209B.

Figure 15:
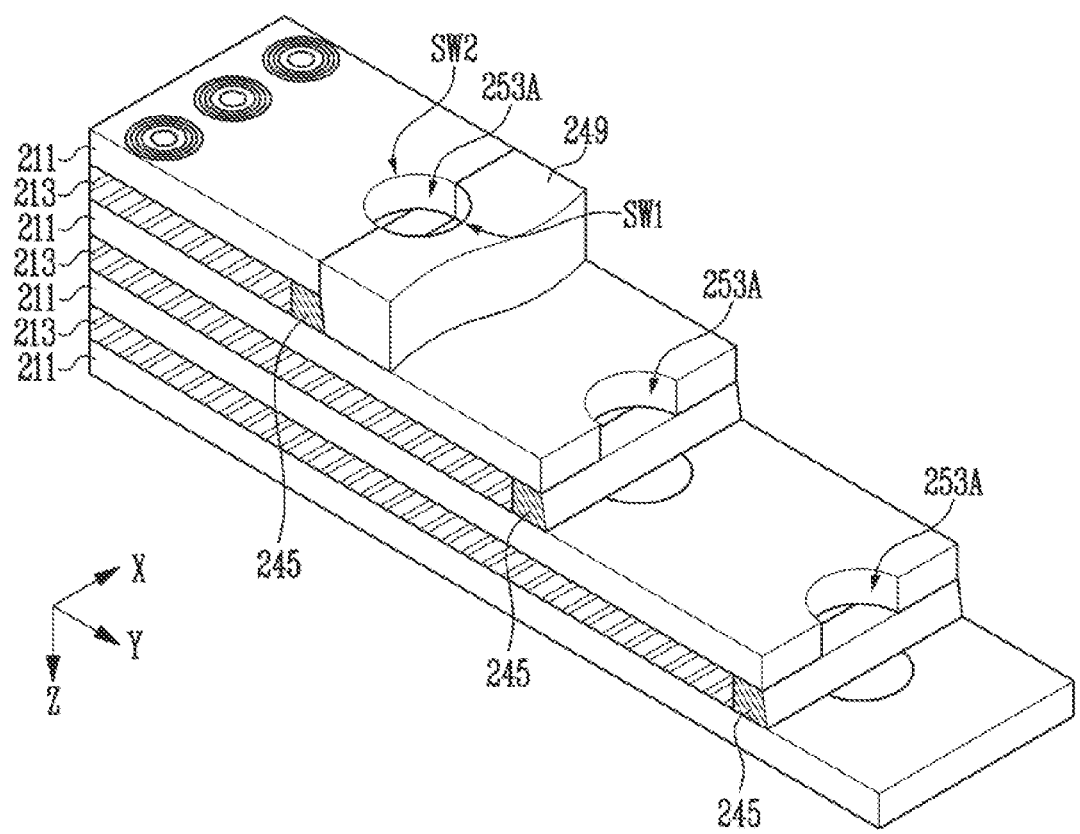
FIG. 15 is a perspective view illustrating a portion of a first contact hole shown in FIG. 14A.

FIG. 15 is a perspective view illustrating a portion of the first contact hole 253A shown in FIG. 14A. FIG. 15 illustrates only a portion of the gap fill insulating layer 249 to help understanding of a structure of each of the first contact hole 253A and the gap fill pattern 245.

Referring to FIG. 15, the first contact hole 253A may overlap with the gap fill pattern 245. The first contact hole 253A may extend in the third direction Z intersecting a plane extending in the first direction X and the second direction Y, to intersect the gap fill pattern 245. In other words, the first contact hole 253A may penetrate the first and second material layers 211 and 213 disposed under the gap fill pattern 245.

The first contact hole 253A may include a first sidewall SW1 and a second sidewall SW2. The first sidewall SW1 may form a common surface with a sidewall of the gap fill insulating layer 249 at one side of the gap fill pattern 245. The second sidewall SW2 may extend from the first sideman SW1, and form a common surface with sidewalls of the first and second material layers 211 and 213 at the other side of the gap fill pattern 245.

FIGS. 16A, 16B, 17A, and 17B are process sectional views illustrating a process of forming spacer insulating layers and sacrificial pillars in accordance with an embodiment of the present disclosure.

Figure 16B:
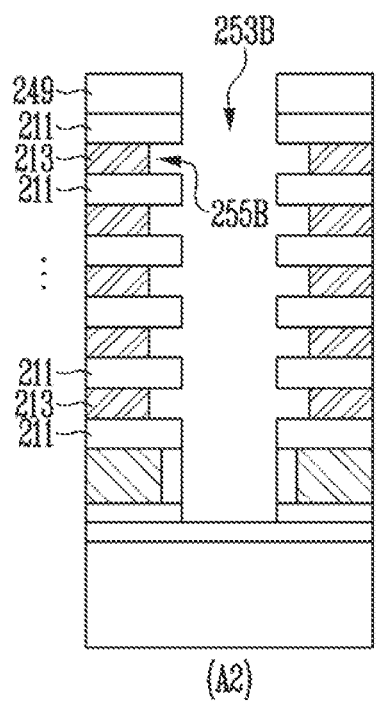

Referring to FIGS. 16A and 16B, a portion of each of the second material layers 213 may be etched through the first contact holes 253A and the second contact hole 253B. Accordingly, gaps 255A and 255B may be defined between the first material layers 211.

The second material layers 213 may be selectively etched. In an embodiment, the second material layers 213 formed of a nitride layer may be selectively etched through a phosphoric acid.

The gaps 255A and 255B may include second gaps 255A overlapping with the first region A1 of the sacrificial substrate 201 and third gaps 255B overlapping with the second region A2 of the sacrificial substrate 201. The second gaps 255A may be connected to the first contact holes 253A, and may extend between the first material layers 211. The third gaps 255B may be connected to the second contact hole 253B, and may extend between the first material layers 211.

Figure 17A:
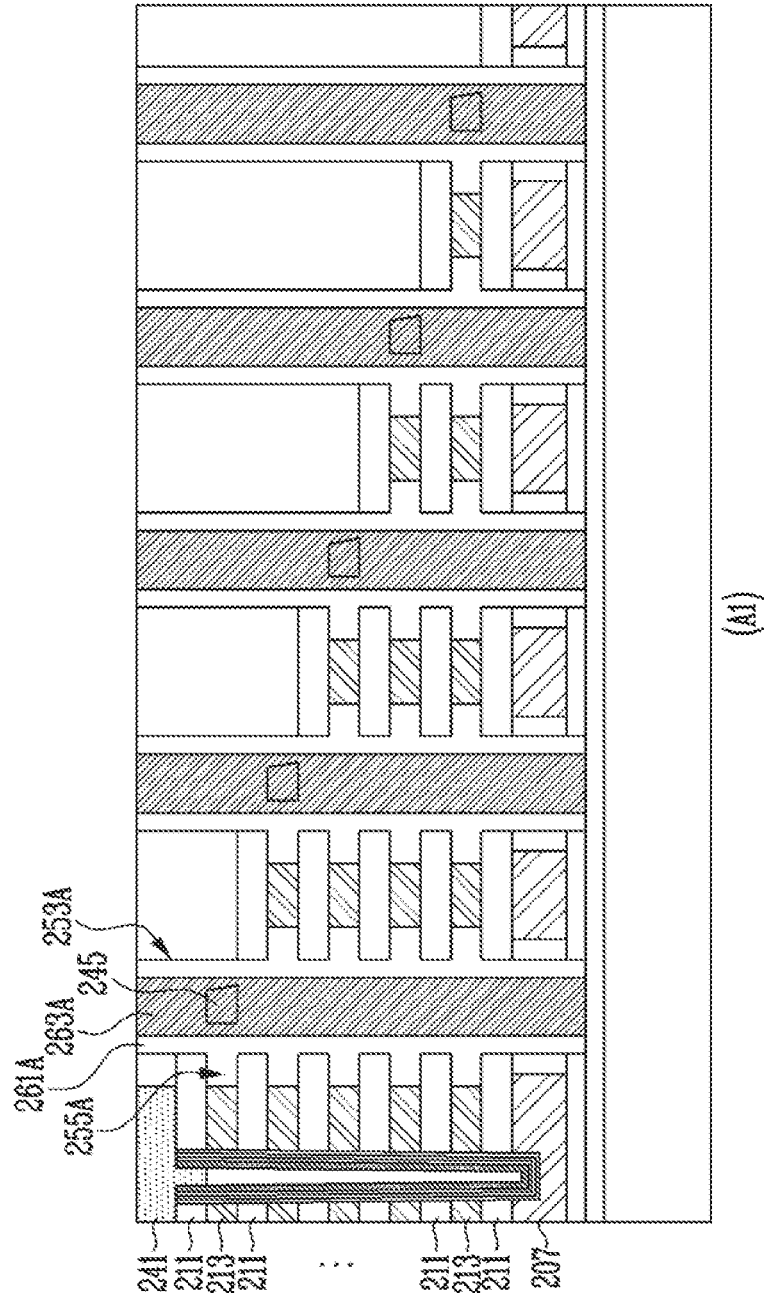
Figure 17B:
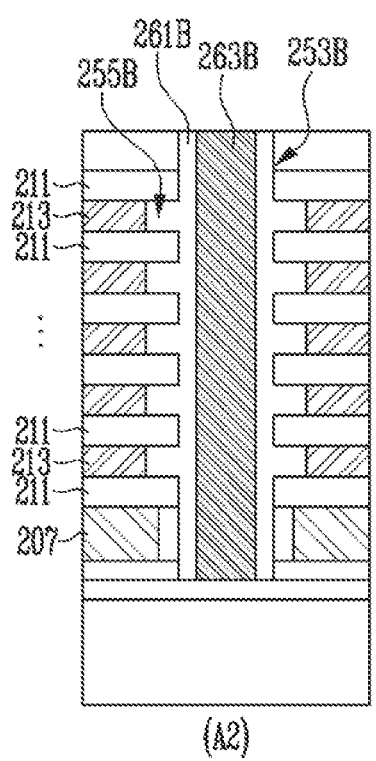

Referring to FIGS. 17A and 17B, spacer insulating layers 261A and 261B may be formed on sidewalls of the first contact holes 253A and the second contact hole 253B. The spacer insulating layers 261A and 261B may be formed of an insulating material having an etch selectivity with respect to the second material layers 213. In an embodiment, each of the spacer insulating layers 261A and 261B may include an oxide layer.

The process of forming the spacer insulating layers 261A and 261B may include a process of forming an insulating layer on surfaces of the first and second contact holes 253A and 253B and a process of removing a portion of the insulating layer through an etch-back process such that surfaces of the gap fill patterns 245 are exposed.

The spacer insulating layers 261A and 261B may include a gate spacer insulating layers 261A respectively disposed on the sidewalk of the first contact holes 253A and a dummy spacer insulating layer 261B disposed on the sidewall of the second contact hole 253B. The gate spacer insulating layers 261A may open central regions of the first contact holes 253A, and may extend between the first material layers 211 to fill the second gaps 255A. The dummy spacer insulating layer 261B may open a central region of the second contact hole 253B, and may extend between the first material layers 211 to fill the third gaps 255B.

Subsequently, sacrificial pillars 263A and 263B may be formed. The sacrificial pillars 263A and 263B may be formed of a material having an etch selectivity with respect to the gate spacer insulating layers 261A and the dummy spacer insulating layer 261B. In an embodiment, the sacrificial pillars 263A and 263B may include at least one of silicon, metal, a titanium nitride layer (TiN), and a silicon carbon nitride layer (SiCN). The sacrificial pillars 263A and 263B may be formed of the same material as the gap fill patterns 245.

The sacrificial pillars 263A and 263B may include first sacrificial pillars 263A and a second sacrificial pillar 263B. The first sacrificial pillars 263A may be formed to fill the central regions of the first contact holes 253A opened by the gate spacer insulating layers 261A. The first sacrificial pillars 263A may be respectively connected to the gap fill patterns 245. The second sacrificial pillar 263B may be formed to fill the central region of the second contact hole 253B opened by the dummy spacer insulating layer 261B.

Figure 18A:
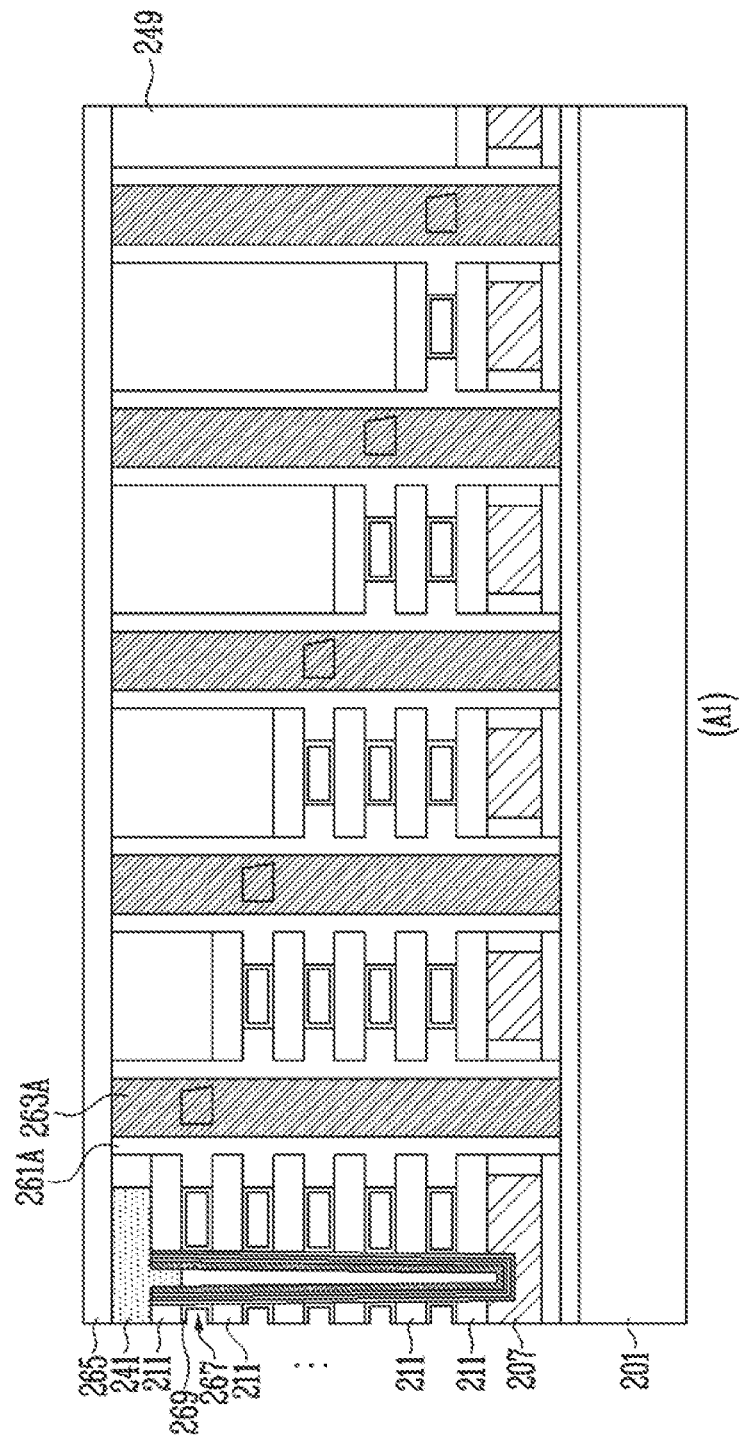
FIGS. 18A and 18B are process sectional views illustrating processes of forming a cell stack structure in accordance with an embodiment of the present disclosure.
Figure 18B:
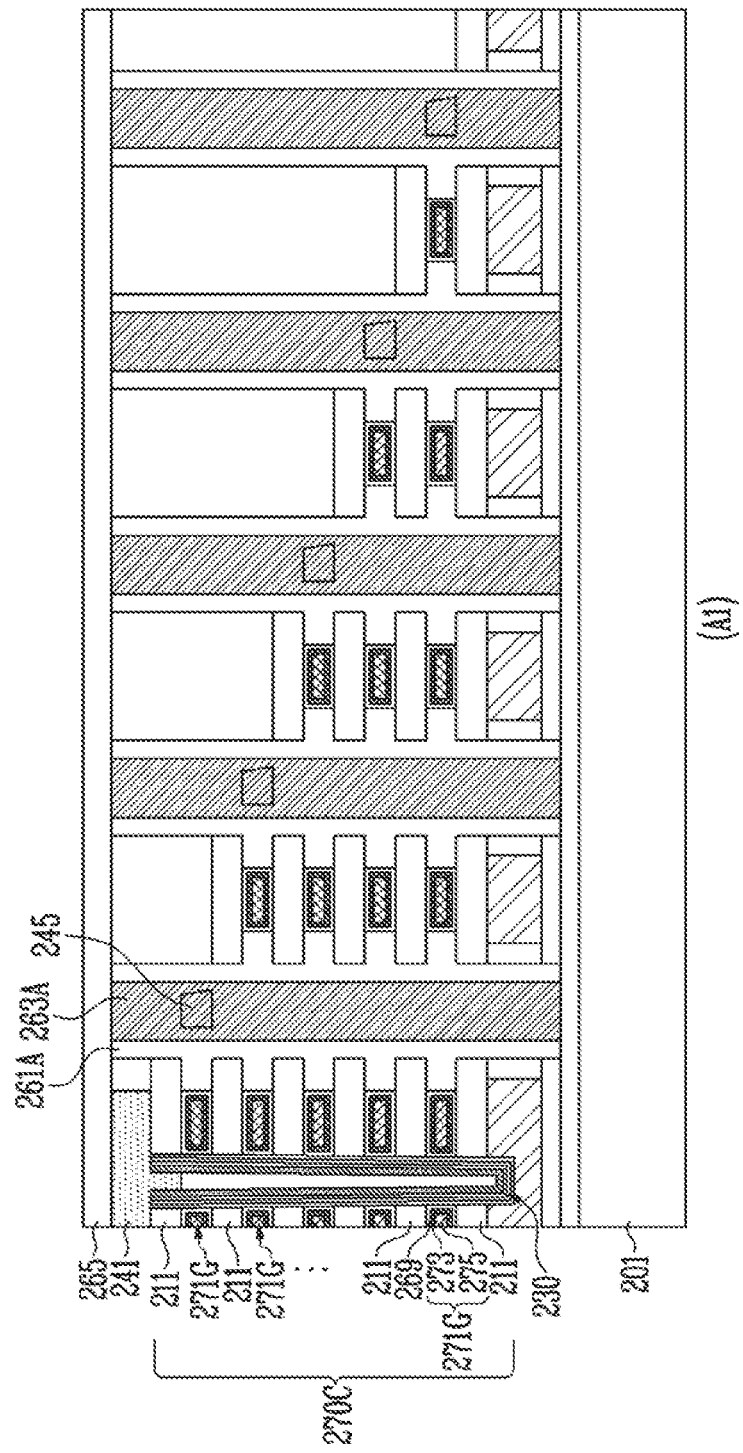

FIGS. 18A and 18B are process sectional views illustrating processes of forming a cell stack structure in accordance with an embodiment of the present disclosure.

Referring to FIG. 18A, an oxide layer 265 may be formed on the gap fill insulating layer 249 penetrated by the first sacrificial pillars 263A and the first spacer insulating layers 261A. The oxide layer 265 may extend to cover the doped semiconductor layer 241. Subsequently, a slit may be formed by etching the first material layers 211 and the second material layers, which overlap with the first region A1 of the sacrificial substrate 201, and the oxide layer 265. The slit may correspond to the slit SI shown in FIG. 5.

Subsequently, the second material layers overlapping with the first region A1 of the sacrificial substrate 201 may be selectively removed through the slit. Accordingly, horizontal spaces 267 may be exposed between the first material layers 211 overlapping with the first region A1 of the sacrificial substrate 201.

Subsequently, a second blocking insulating layer 269 may be formed on a surface of each of the horizontal spaces 267. In an embodiment, the second blocking insulating layer 269 may include an aluminum oxide layer. However, the present disclosure is not limited thereto. In an embodiment, the second blocking insulating layer 269 may be excluded in the horizontal space 267, and be formed on the surface of the channel hole 220 before the first blocking insulating layer 223 shown in FIG. 10A is formed.

Referring to FIG. 18B, the horizontal spaces 267 shown in FIG. 18A may be filled with gate conductive patterns 271G. Accordingly, a cell stack structure 270C may be formed. The cell stack structure 270C may include the first material layers 211 and the gate conductive patterns 271G, which surround the channel structure 230 and are alternately stacked on the first region A1 of the sacrificial substrate 201.

In an embodiment, the process of forming the gate conductive patterns 271G may include a process of forming a conductive barrier layer 273 on the second blocking insulating layer 269, a process of forming a metal layer 275 on the conductive barrier layer 273 to fill the horizontal spaces 267 shown in FIG. 18A, and a process of separating the conductive barrier layer 273 and the metal layer 275 into the gate conductive patterns 271G.

The gate conductive pattern 271G of the present disclosure is not limited to the embodiment including the conductive barrier layer 273 and the metal layer 275, and the conductive material of the gate conductive pattern 271G may be various.

Figure 19:
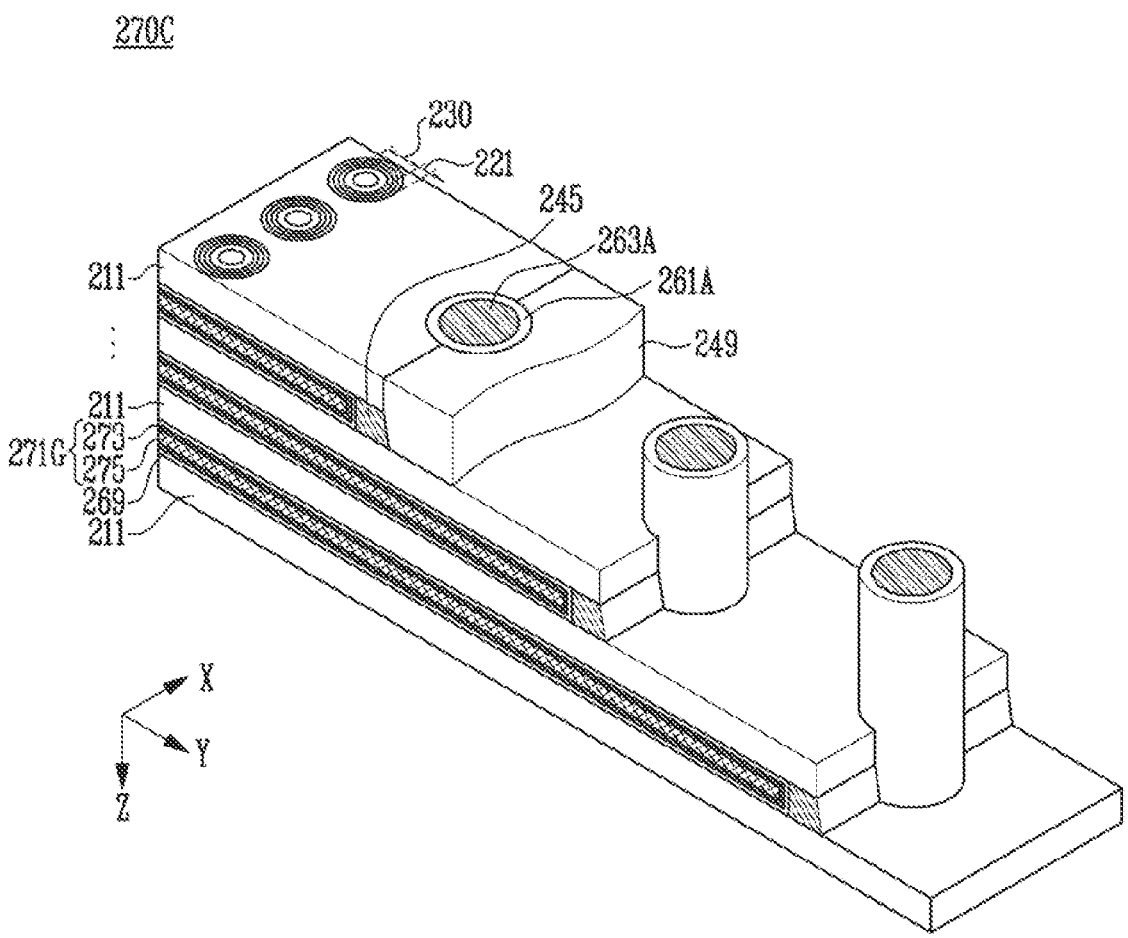
FIG. 19 is a perspective view illustrating a portion of the cell stack structure shown in FIG. 18B.

FIG. 19 is a perspective view illustrating a portion of the cell stack structure 270C shown in FIG. 18B, FIG. 19 illustrates only a portion of the gap fill insulating layer 249 to help understanding of a structure of each of the first sacrificial pillars 263A, the first spacer insulating layers 261A, and the gap fill pattern 245.

Referring to FIG. 19, the cell stack structure 270 may include the gate conductive patterns 271G spaced apart from each other by the first material layers 211. The gate conductive patterns 271G may surround the channel structure 230 and the memory layer 221, and may extend toward the first sacrificial pillars 263A and the gap fill patterns 245.

The gate conductive patterns 271G may be spaced apart from the first sacrificial pillars 263A by the gate spacer insulating layers 261A.

In an embodiment, the second blocking insulating layer 269 may extend between the gate conductive patterns 271G and the gap fill patterns 245. In an embodiment, the conductive barrier layer 273 of each of the gate conductive patterns 271G may extend between the gap fill pattern 245 and the metal layer 275.

Figure 20:
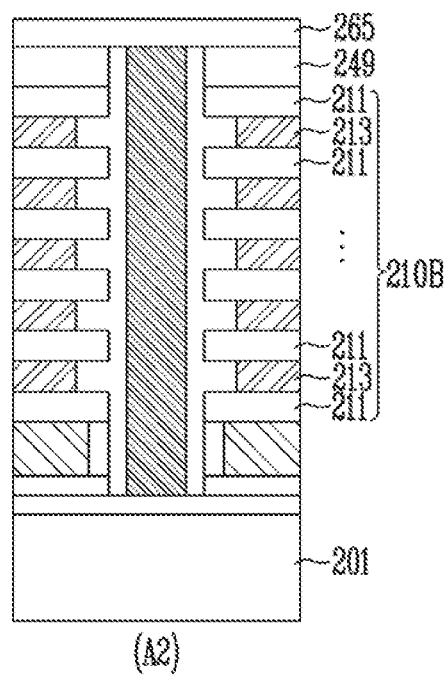
FIG. 20 is a sectional view illustrating a structure formed on a second region of a sacrificial substrate while the cell stack structure shown in FIG. 19 is formed.

FIG. 20 is a sectional view illustrating a structure formed on the second region A2 of the sacrificial substrate 201 while the cell stack structure 270C shown in FIG. 19 is formed.

Referring to FIG. 20, the oxide layer 265 shown in FIG. 18A may extend to overlap with the second region A2 of the sacrificial substrate 201. In other words, the oxide layer 265 may overlap with the dummy stack structure 210B. While the second material layers overlapping with the first region of the sacrificial substrate 201 are replaced with the gate conductive patterns, the second material layers 211 of the dummy stack structure 210B are not removed but may remain.

The shape of the slit SI shown in FIG. 5 may be variously designed to replace only the second material layers overlapping with the first region of the sacrificial substrate 201 with the gate conductive patterns.

Figure 21A:
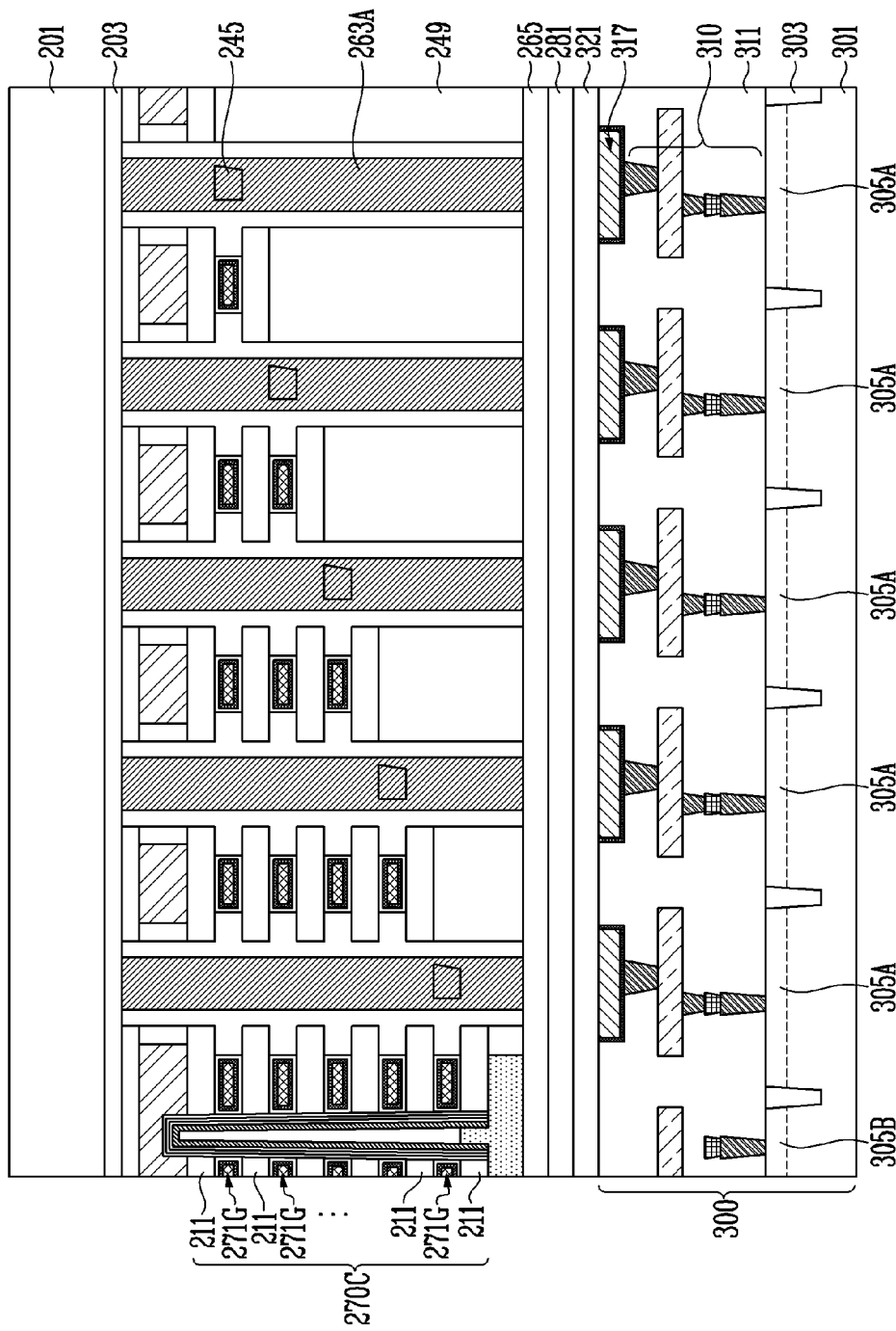
FIGS. 21A and 21B are sectional views illustrating a bonding process in accordance with an embodiment of the present disclosure.
Figure 21B:
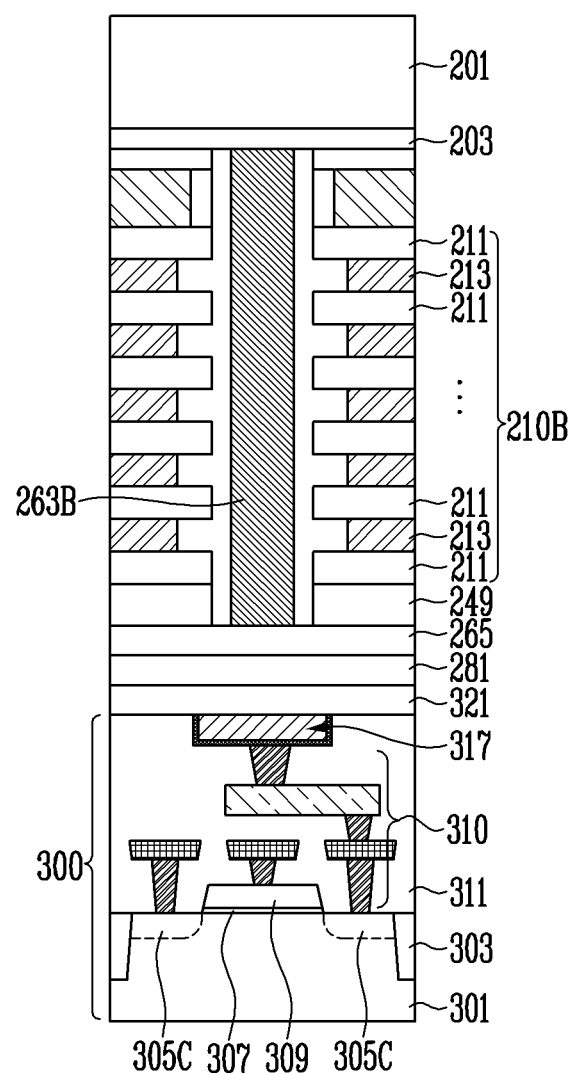

FIGS. 21A and 21B are sectional views illustrating a bonding process in accordance with an embodiment of the present disclosure.

Referring to FIGS. 21A and 21B, before the bonding process is performed, a first insulating layer 281 may be formed on the oxide layer 265. The first insulating layer 281 may extend to overlap with the cell stack structure 270C, the dummy stack structure 210B, the first sacrificial pillars 263A, and the second sacrificial pillar 263B.

The first insulating layer 281 may be bonded to a second insulating layer 321 covering a peripheral circuit layer 300 through the bonding process. The peripheral circuit layer 300 covered by the second insulating layer 321 may be provide before the bonding process is performed.

As described with reference to FIGS. 6 and 9, the peripheral circuit layer 300 may include a substrate 301 including isolation layers 303 and impurity regions 305A, 305B, and 305C, a gate insulating layer 307 and a gate electrode 309, which are stacked on the substrate 301, interconnection structures 310, and conductive pads 317. The gate electrode 309, the interconnection structures 310, and the conductive pads 317 may be buried in an insulating structure 311 formed on the substrate 301. The second insulating layer 321 may be disposed on the insulating structure 311, and may extend to cover the conductive pads 317.

The first insulating layer 281 and the second insulating layer 321 may be formed of various dielectrics. In an embodiment, each of the first insulating layer 281 and the second insulating layer 321 may include an oxide layer. The first insulating layer 281 and the second insulating layer 321 may define a bonding structure in which dielectric layers are bonded together.

Figure 22A:
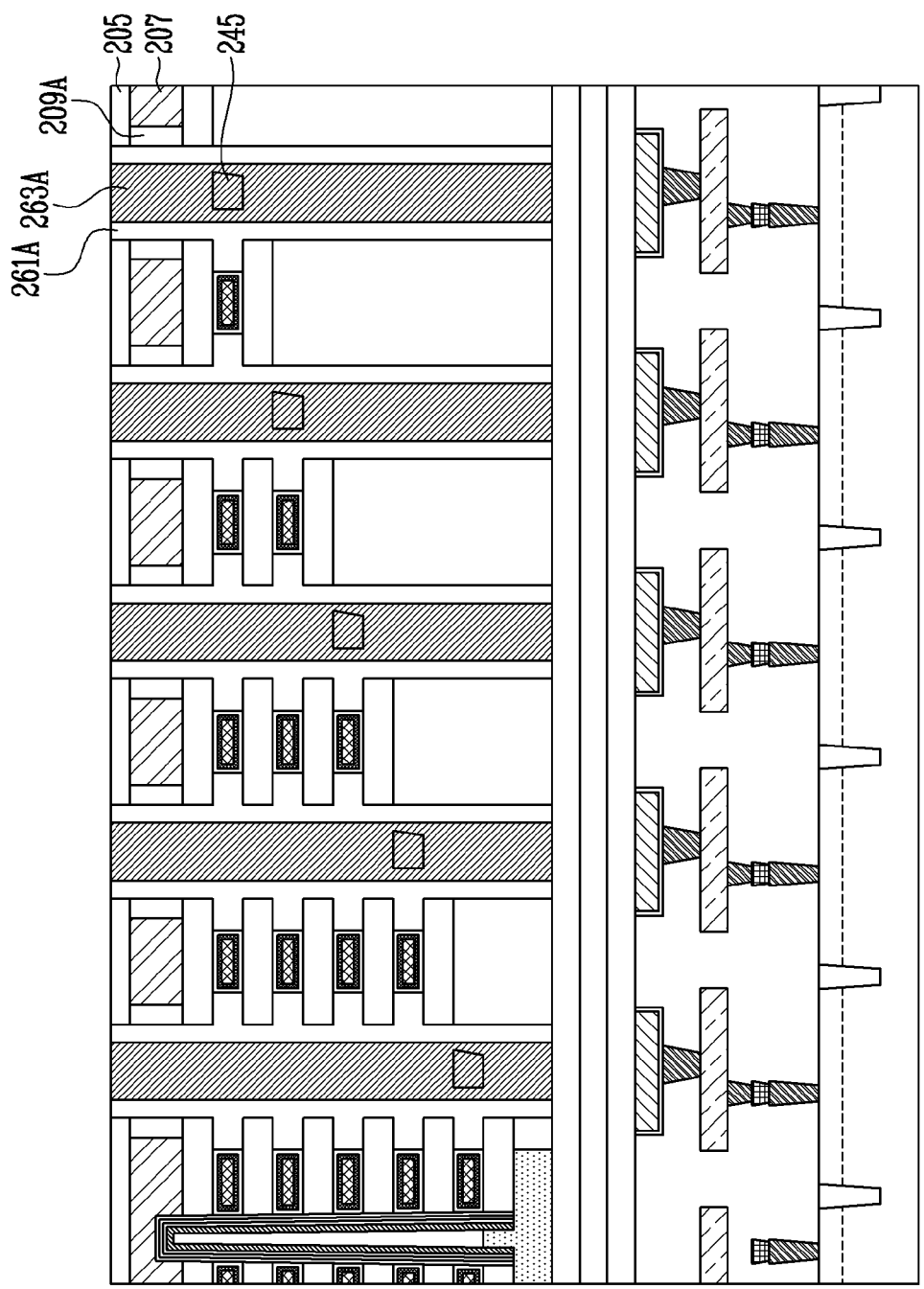
FIGS. 22A and 22B are sectional views illustrating a process of exposing sacrificial pillars in accordance with an embodiment of the present disclosure.
Figure 22B:
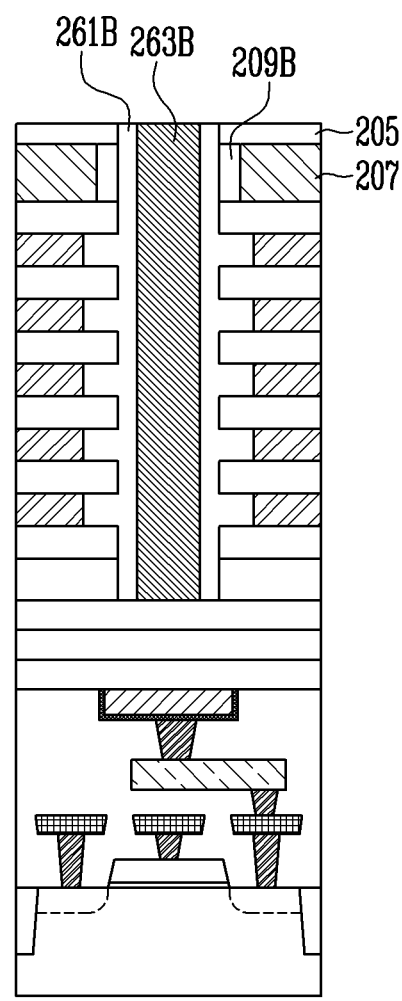

FIGS. 22A and 22B are sectional views illustrating a process of exposing the sacrificial pillars 263A and 263B in accordance with an embodiment of the present disclosure.

Referring to FIGS. 22A and 22B, after the bonding process, the sacrificial substrate 201 shown in FIGS. 21A and 21B may be removed. While the sacrificial substrate 201 is removed, the first sacrificial pillars 263A and the second sacrificial pillar 263B may be protected by the first protective layer 203 shown in FIGS. 21A and 21B.

Subsequently, the first protective layer 203 shown in FIGS. 21A and 21B may be removed such that the first sacrificial pillars 263A and the second sacrificial pillar 263B are exposed. In an embodiment, the first protective layer 203 may be removed by performing a planarization process such that the first sacrificial pillars 263A and the second sacrificial pillar 263B are exposed.

Figure 23B:
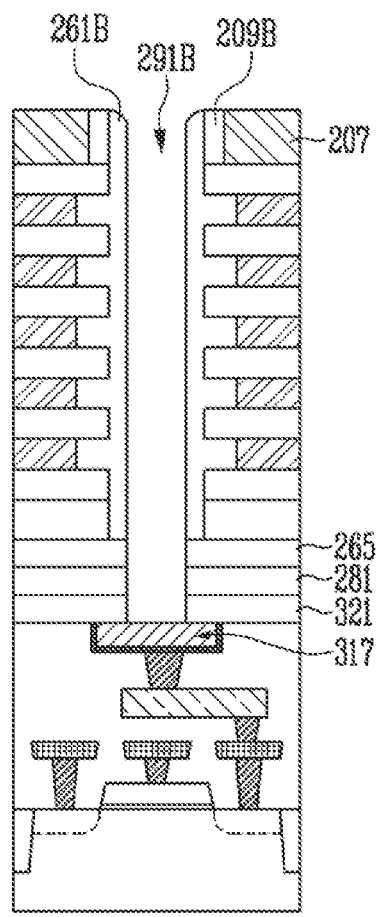

FIGS. 23A and 23B are sectional views illustrating a process of exposing the conductive pads 317.

Referring to FIGS. 23A and 23B, the gate spacer insulating layers 261A and the dummy spacer insulating layer 261B may be exposed by selectively removing the first sacrificial pillars 263A and the second sacrificial pillar 263B, which are shown in FIGS. 22A and 22B. The gap fill patterns 245 shown in FIG. 22A may be removed through an etching material for removing the first sacrificial pillars 263A. While the first sacrificial pillars 263A and the second sacrificial pillar 263B are removed, the third protective layer 207 may be protected by the second protective layer 205 shown in FIGS. 22A and 22B.

Subsequently, vertical holes 291A and 291B exposing the conductive pads 317 may be formed by etching the oxide layer 265, the first insulating layer 281, and the second insulating layer 321, which are exposed through portions at which the first sacrificial pillars 263A and the second sacrificial pillar 263B, which are shown in FIGS. 22A and 22B, are removed. In the process of forming the vertical holes 291A and 291B, the second protective layer shown in FIGS. 22A and 22B may be removed, and the third protective layer 207 may be exposed.

The vertical holes 291A and 291B may include first vertical holes 291A having a sidewall defined by the gate spacer insulating layers 261A and a second vertical hole 291B having a sidewall defined by the dummy spacer insulating layer 261B.

Figure 24:
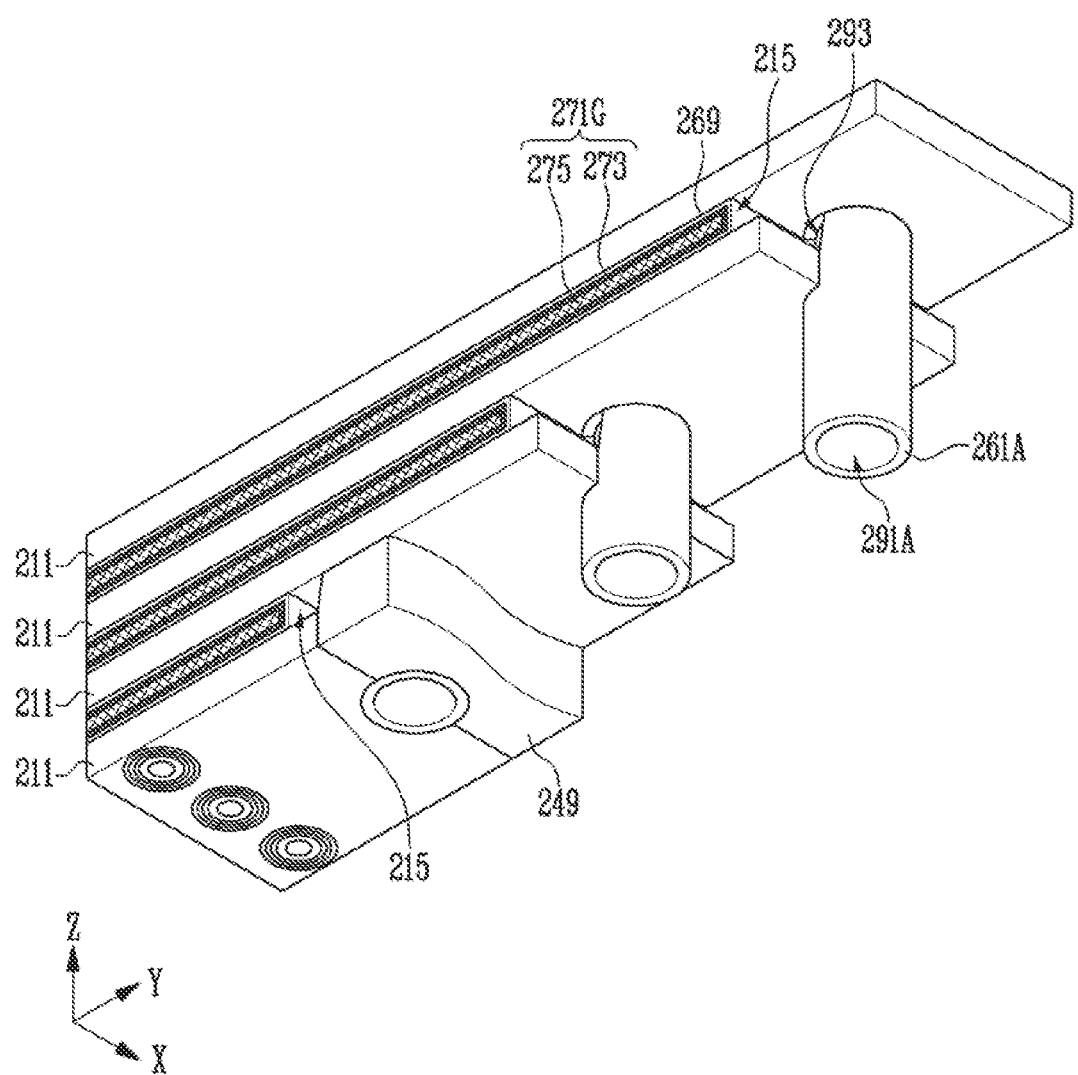
FIG. 24 is a perspective view illustrating a portion of a first vertical hole shown in FIG. 23A.

FIG. 24 is a perspective view illustrating a portion of the first vertical hole 291A shown in FIG. 23A. FIG. 24 illustrates only a portion of the gap fill insulating layer 249 to help understanding of a structure of a through part 293.

Referring to FIG. 24, the first vertical hole 291A may be surrounded by the gate spacer insulating layer 261A. The first vertical hole 291A may be connected to the first gap 215 through the through part 293 penetrating the gate spacer insulating layer 261A.

The first gap 215 and the through part 293 may be opened as the gap fill pattern 245 shown in FIG. 22A is removed. The first gap 215 is a region defined between the first material layers 211 as described with reference to FIG. 10D. The second blocking insulating layer 269 or the gate conductive pattern 271G may be exposed by the first gap 215. In an embodiment, the second blocking insulating layer 269 may be exposed by the first gap 215.

Figure 25:
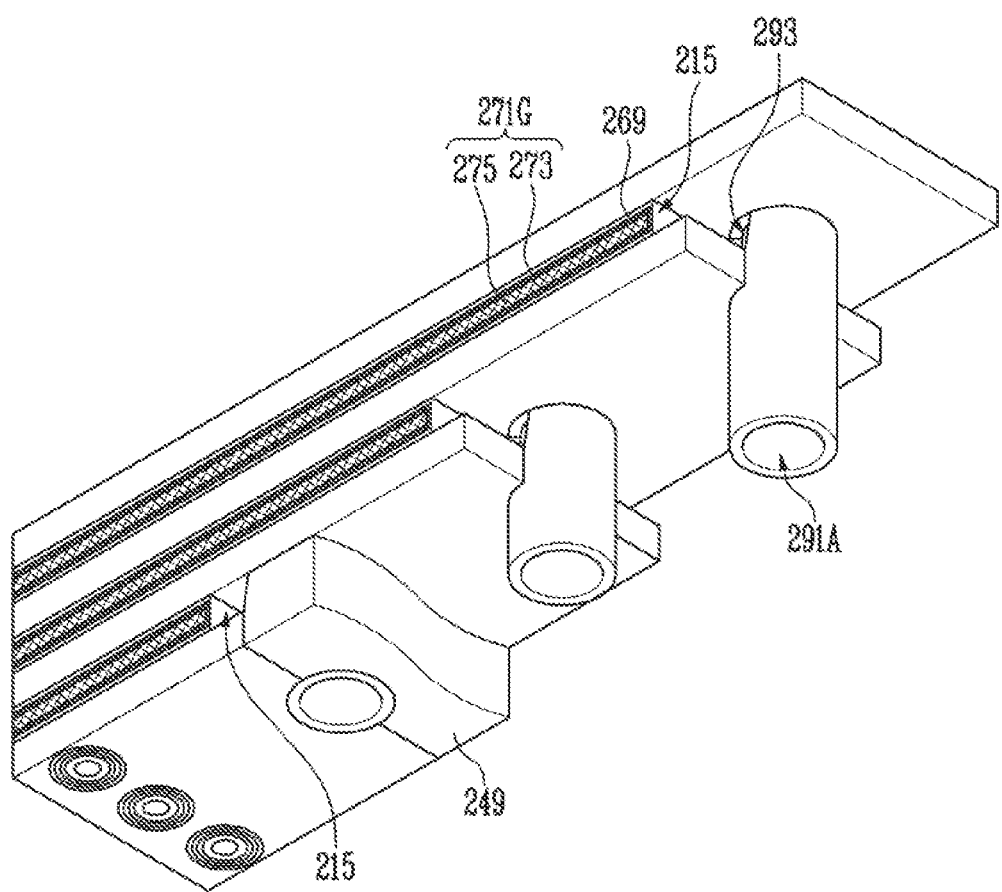
FIGS. 25 and 26 are perspective views illustrating a process of forming a gate contact structure in accordance with an embodiment of the present disclosure.

FIGS. 25 and 26 are perspective views illustrating a process of forming a gate contact structure in accordance with an embodiment of the present disclosure. FIGS. 25 and 26 illustrate only a portion of the gap fill insulating layer 249 to help understanding of a structure of each of the through part 293 and a gate contact structure 290A.

Referring to FIG. 25, a sidewall of the gate conductive pattern 271G may be exposed by removing a portion of the second blocking insulating layer 269 is exposed through the first gap 215. In an embodiment, the conductive barrier layer 273 of the gate conductive pattern 271G may be exposed by removing a portion of the second blocking insulating layer 269.

Referring to FIG. 26, the gate contact structure 290A may be formed by filling the first gap 215, the through part 293, and the first vertical hole 291A, which are shown in FIG. 25, with a conductive material. The gate contact structure 290A may include a horizontal part 290HP filling the first gap 215 and the through part 293, which are shown in FIG. 25, and a vertical part 290VP filling the first vertical hole 291A shown in FIG. 25.

In an embodiment, the gate contact structure 290A may include a conductive barrier layer 295A and a metal layer 297A. The conductive barrier layer 295A of the gate contact structure 290A may constitute a surface of each of the horizontal part 290HP and the vertical part 290VP, and the metal layer 297A of the gate contact structure 290A may constitute a central region of each of the horizontal part 290HP and the vertical part 290VP.

The horizontal part 290HP of the gate contact structure 290A may be in contact with the sidewall of the gate conductive pattern 271G, and the vertical part 290VP of the gate contact structure 290A may be spaced apart from the gate conductive pattern 271G by the gate spacer insulating layer 261A. In an embodiment, a conductive barrier layer 295A of the horizontal part 290HP may be in contact with the conductive barrier layer 273 of the gate conductive pattern 271G.

Figure 27B:
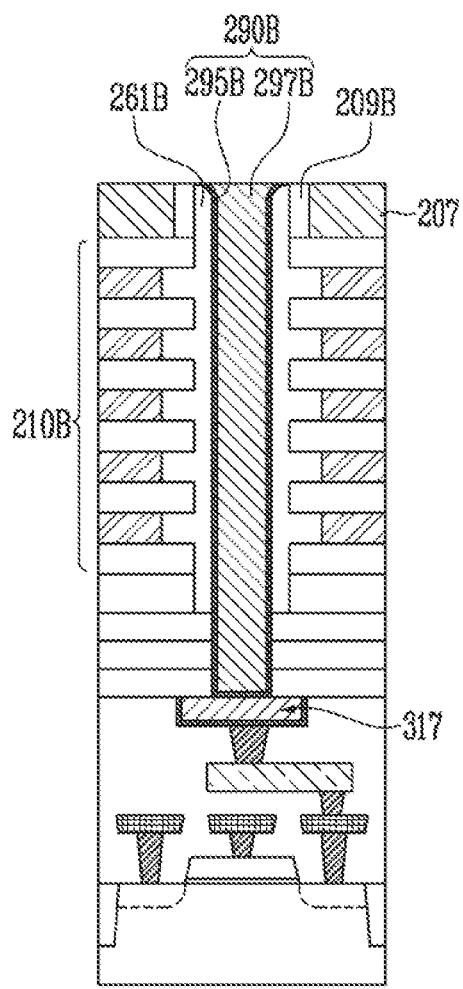

FIGS. 27A and 27B are sectional views illustrating the gate contact structure 290A and a vertical contact structure 290B in accordance with an embodiment of the present disclosure. FIG. 27A illustrates the gate contact structure shown in FIG. 26.

Referring to FIG. 27A, the sacrificial pillar 263A shown in FIG. 21A may be replaced with the gate contact structure 290A through the processes described with reference to FIGS. 22A, 23A, 24, 25, and 26.

Referring to FIG. 27B, the second sacrificial pillar 263B shown in FIG. 21B may be replaced with the vertical contact structure 290B by using a process of replacing the first sacrificial pillar 263A shown in FIG. 21A with the gate contact structure 290A shown in FIG. 27B. The vertical contact structure 290B may fill the second vertical hole 291B shown in FIG. 23B. The vertical contact structure 290B may be spaced apart from the dummy stack structure 210B by the dummy spacer insulating layer 261B.

Referring to FIGS. 27A and 27B, the gate contact structure 290A and the vertical contact structure 290B may be respectively in contact with different conductive pads 317. The vertical contact structure 290B may include the same conductive material as the gate contact structure 290A. In an embodiment, the vertical contact structure 290B may include a conductive barrier layer 295B and a metal layer 297B.

In the process of forming the gate contact structure 290A and the vertical contact structure 290B, a conductive material may be formed to fill the first vertical hole 291A and the second vertical hole 291B, which are shown in FIGS. 23A and 23B, and may be planarized through a Chemical Mechanical Polishing (CMP) process, etc. The planarization process may be stopped when the third protective layer 207 is exposed. Accordingly, the conductive material may be separated into the gate contact structure 290A and the vertical contact structure 290B.

Figure 28A:
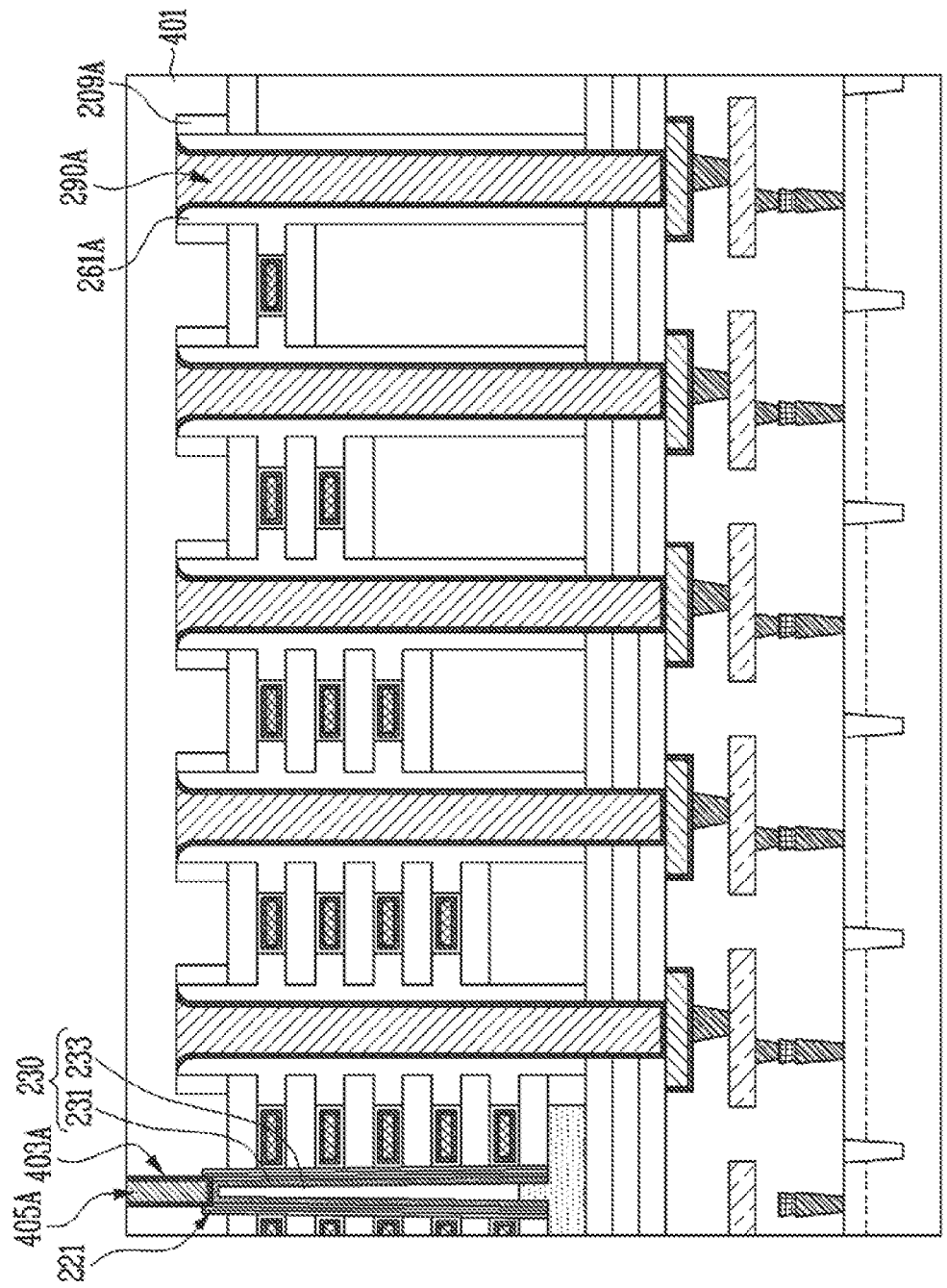
FIGS. 28A and 28B are sectional views illustrating an embodiment of a subsequent process continued after the gate contact structure and the vertical contact structure are formed.
Figure 28B:
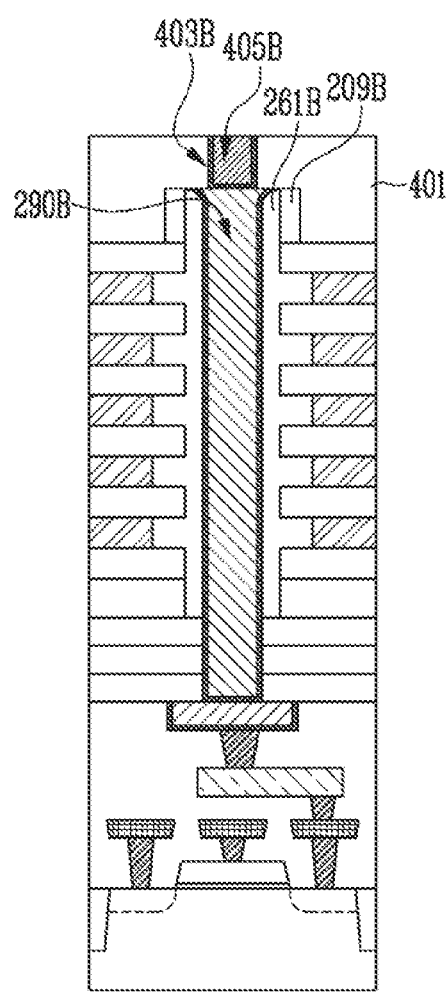

FIGS. 28A and 28B are sectional views illustrating an embodiment of a subsequent process continued after the gate contact structure 290A and the vertical contact structure 290B are formed.

Referring to FIGS. 28A and 28B, the third protective layer 207 shown in FIGS. 27A and 27B may be removed such that the memory layer 221 is exposed. Subsequently, an upper insulating layer 401 may be formed. The upper insulating layer 401 may extend to cover the memory layer 221, the gate contact structure 290A, the vertical contact structure 290B, the gate spacer insulating layer 261A, the dummy spacer insulating layer 261B, the first insulating pattern 209A, and the second insulating pattern 209B.

Subsequently, upper holes 403A and 403B may be formed. The upper holes 403A and 403B may include a first upper hole 403A and second upper hole 403B. The first upper hole 403A may penetrate the upper insulating layer 410 and the memory layer 221 to expose the channel layer 231 of the channel structure 230. The second upper hole 403B may penetrate the upper insulating layer 401 to expose the vertical contact structure 290B.

Subsequently, an impurity may be injected into a portion of the channel layer 231 exposed through the first upper hole 403A. In an embodiment, an n-type impurity may be injected into the channel layer 231.

Continuously, a channel contact structure 405A filling the first upper hole 403A and a via plug 405B filling the second upper hole 403B may be formed. Each of the channel contact structure 405A and the via plug 405 may include a conductive barrier layer and a metal layer as described with reference to FIGS. 6 and 9.

Subsequently, subsequent processes for forming the bit line BL and the upper lines UL1 and UL2, which are shown in FIGS. 6 and 9, may be performed.

Figure 29:
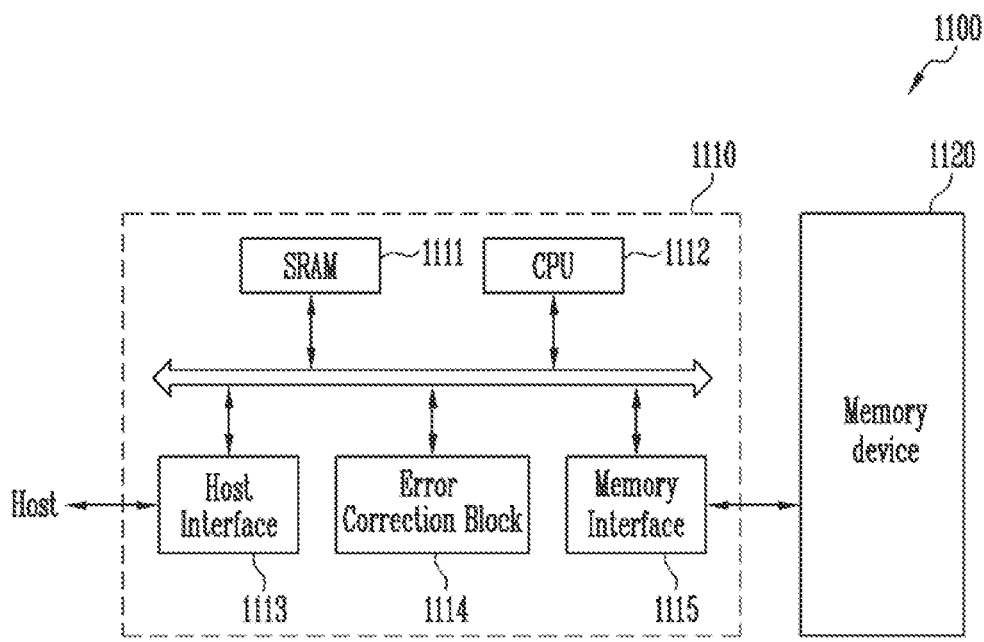
FIG. 29 is a block diagram illustrating a configuration of a memory system in accordance with an embodiment of the present disclosure.

FIG. 29 is a block diagram illustrating a configuration of a memory system 1100 in accordance with an embodiment of the present disclosure.

Referring to FIG. 29, the memory system 1100 includes a memory device 1120 and a memory controller 1110.

The memory device 1120 may be a multi-chip package configured with a plurality of flash memory chips. The memory device 1120 may include a peripheral circuit layer and a stack structure, which are bonded to each other through a bonding structure. The stack structure may include at least one of a cell stack structure and a dummy stack structure. A gate contact structure connected to a gate conductive pattern of the cell stack structure may include a vertical part which penetrates the cell stack structure and the bonding structure and is spaced apart from the gate conductive pattern, and a horizontal part extending from the vertical part to be in contact with the gate conductive pattern. The dummy stack structure may be penetrated by a vertical contact structure connected to the peripheral circuit layer. Similarly to the vertical part of the gate contact structure, the vertical contact structure may be spaced apart from the dummy stack structure, and penetrate the bonding structure.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include a Read Only Memory (ROM) for storing code data for interfacing with the host, and the like.

The memory system 1100 may be a memory card or a Solid State Drive (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer System Interface (SCSI) protocol, an Enhanced Small Disk Interface (ESDI) protocol, and an Integrated Drive Electronics (IDE) protocol, FIG. 30 is a block diagram illustrating a configuration of a computing system 1200 in accordance with an embodiment of the present disclosure.

Figure 30:
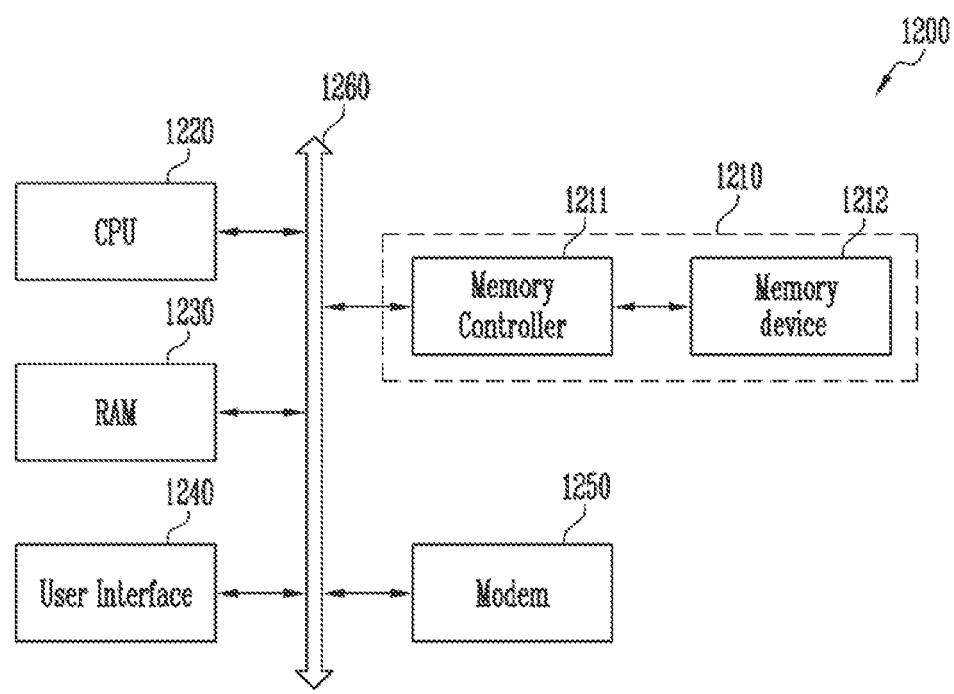
FIG. 30 is a block diagram illustrating a configuration of a computing system in accordance with an embodiment of the present disclosure.

Referring to FIG. 30, the computing system 1200 may include a CPU 1220, a random access memory (RAM) 1230, a user interface 1240, a modem 1250, and a memory system 1210, which are electrically connected to a system bus 1260.

When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211. The memory device 1212 may be configured the same as the memory device 1120 described with reference to FIG. 29. The memory controller 1211 may be configured the same as the memory controller 1100 described with reference to FIG. 29.

In accordance with the present disclosure, because a gate contact structure and a vertical contact structure penetrate a bonding structure and are connected to a peripheral circuit layer, the bonding structure may be simplified to a structure in which dielectric layers are bonded together. Accordingly, a bonding structure failure may be minimized, and thus the operational reliability of the semiconductor memory device may be improved.

In accordance with the present disclosure, because a vertical part of the gate contact structure connected to the peripheral circuit layer is spaced from multi-layered gate conductive patterns, an operation failure occurring when the vertical part of the gate contact structure is commonly connected to the multi-layered conductive patterns may be improved.

In accordance with the present disclosure, a horizontal part extending from the vertical part of the gate contact structure is self-aligned at a level at which one gate conductive pattern among the multi-layered gate conductive patterns is disposed. Accordingly, the one gate conductive pattern may be stably connected to the gate contact structure, and thus the operational reliability of the semiconductor memory device may be improved.

In accordance with the present disclosure, the vertical contact structure penetrating a dummy stack structure is formed by using a process of forming the gate contact structure, so that the manufacturing time of the semiconductor memory device may be reduced.

What is claimed is:

1. A semiconductor memory device comprising:
   a peripheral circuit layer;
   a bonding structure disposed over the peripheral circuit layer;
   a channel structure disposed over the bonding structure;
   a first gate contact structure including a first vertical part penetrating the bonding structure and a first horizontal part intersecting with the first vertical part and extending from the first vertical part;
   a first gate conductive pattern coupled to a sidewall of the first horizontal part and spaced apart from the first vertical part by a gap,
      wherein the first gate conductive pattern extends to surround the channel structure; and
   a first gate spacer insulating layer including a first portion having a first width between the first vertical part and the first gate conductive pattern, and a second portion having a second width smaller than the first width on a portion of the first vertical part,
   wherein the first portion and the second portion are located at a same level.

2. The semiconductor memory device of claim 1,
   wherein the bonding structure includes a structure in which dielectric layers are bonded together.
3. The semiconductor memory device of claim 1, further comprising:
   a second gate conductive pattern surrounding the channel structure, the second gate conductive pattern disposed between the first gate conductive pattern and the bonding structure; and
   a second gate contact structure disposed between the second gate conductive pattern and the first gate contact structure,
   wherein the second gate contact structure includes a second vertical part penetrating the bonding structure and the first gate conductive pattern and a second horizontal part extending from the second vertical part, and
   wherein a sidewall of the second horizontal part is in contact with the second gate conductive pattern.
4. The semiconductor memory device of claim 3,
   wherein the first gate conductive pattern further protrudes toward the first gate contact structure than the second gate conductive pattern.
5. The semiconductor memory device of claim 3, further comprising:
   a first interlayer insulating layer surrounding the channel structure between the first gate conductive pattern and the second gate conductive pattern;
   a second interlayer insulating layer overlapping with the first interlayer insulating layer with the first gate conductive pattern interposed between the second interlayer insulating layer and the first interlayer insulating layer, wherein the second interlayer insulating layer surrounds the channel structure; and
   a second gate spacer insulating layer surrounding a sidewall of the second vertical part, wherein the second gate spacer insulating layer is penetrated by the second horizontal part,
   wherein the first gate spacer insulating layer surrounds a sidewall of the first vertical part, fills the gap between the first gate conductive pattern and the first vertical part, and is penetrated by the first horizontal part.
6. The semiconductor memory device of claim 5,
   wherein each of the first gate spacer insulating layer and the second gate spacer insulating layer protrudes toward the first gate conductive pattern to fill a gap between the first interlayer insulating layer and the second interlayer insulating layer.
7. The semiconductor memory device of claim 5,
   wherein each of the first gate spacer insulating layer and the second gate spacer insulating layer includes a bottom surface which faces the peripheral circuit layer and overlaps with the bonding structure.
8. The semiconductor memory device of claim 1, wherein the peripheral circuit layer includes:
   a substrate including an impurity region;
   an interconnection structure connected to the impurity region; and
   a conductive pad connected to the interconnection structure and overlapping with the first vertical part.
9. The semiconductor memory device of claim 8,
   wherein the first vertical part extends to be in contact with the conductive pad.

* * * * *